United States Patent
Agarwal et al.

(10) Patent No.: US 11,099,136 B2
(45) Date of Patent: Aug. 24, 2021

(54) 3D GRAPHENE OPTICAL SENSORS AND METHODS OF MANUFACTURE

(71) Applicant: Regents of the University of Minnesota, Minneapolis, MN (US)

(72) Inventors: Kriti Agarwal, Uttar Pradesh (IN); Chunhui Dai, Minneapolis, MN (US); Jeong-Hyun Cho, Woodbury, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 21 days.

(21) Appl. No.: 16/229,919

(22) Filed: Dec. 21, 2018

(65) Prior Publication Data
US 2019/0195809 A1    Jun. 27, 2019

Related U.S. Application Data

(60) Provisional application No. 62/609,813, filed on Dec. 22, 2017.

(51) Int. Cl.
| | |
|---|---|
| *G01N 21/90* | (2006.01) |
| *H01L 31/0203* | (2014.01) |
| *G01N 21/88* | (2006.01) |
| *B82Y 30/00* | (2011.01) |
| *C01B 32/194* | (2017.01) |
| *C01B 32/182* | (2017.01) |

(Continued)

(52) U.S. Cl.
CPC .......... *G01N 21/9009* (2013.01); *B82Y 30/00* (2013.01); *C01B 32/182* (2017.08); *C01B 32/194* (2017.08); *G01N 21/554* (2013.01); *G01N 21/8806* (2013.01); *G01N 21/9036* (2013.01); *H01L 31/0203* (2013.01); *C01B 2204/06* (2013.01); *G01N 2021/869* (2013.01)

(58) Field of Classification Search
CPC ............. G01N 21/554; G01N 21/9036; G01N 21/8806; G01N 21/9009; G01N 2021/869; C01B 32/182; C01B 32/194; C01B 2204/06; B82Y 15/00; B82Y 40/00
See application file for complete search history.

(56) References Cited

U.S. PATENT DOCUMENTS

| | | | |
|---|---|---|---|
| 8,709,829 B2 | 4/2014 | Gracias et al. | |
| 8,983,251 B2 * | 3/2015 | Lu | B82Y 30/00 385/40 |
| 9,676,621 B2 * | 6/2017 | Chen | B82Y 15/00 |

(Continued)

FOREIGN PATENT DOCUMENTS

CN        104569064 A        4/2015

OTHER PUBLICATIONS

Frank H. L. Koppens, Darrick E. Chang, and F. Javier Garcia de Abajo, "Graphene Plasmonics: A Platform for Strong Light Matter Interactions". ACS Nano Lett., pp. 3370-3377 (2011).

(Continued)

*Primary Examiner* — Sang H Nguyen
(74) *Attorney, Agent, or Firm* — Dicke, Billig & Czaja, PLLC

(57) ABSTRACT

3D graphene optical sensors, such as microstructure sensors and nanostructure sensors. The 3D optical sensors include one or more graphene panels shaped to surround an interior, open volume. Graphene plasmons couple across the interior, open volume. The 3D optical sensors can have a polygonal shape or a cylindrical shape.

20 Claims, 27 Drawing Sheets

(51) Int. Cl.
   *G01N 21/552* (2014.01)
   *G01N 21/86* (2006.01)

(56) References Cited

U.S. PATENT DOCUMENTS

| | | | | |
|---|---|---|---|---|
| 2009/0242405 | A1* | 10/2009 | Mayer | H01L 51/0037 |
| | | | | 204/435 |
| 2009/0311190 | A1* | 12/2009 | Gracias | A61B 6/032 |
| | | | | 424/9.3 |
| 2010/0326071 | A1 | 12/2010 | Gracias et al. | |
| 2011/0285999 | A1* | 11/2011 | Kim | G01N 21/552 |
| | | | | 356/445 |
| 2012/0135237 | A1* | 5/2012 | Gracias | B81C 1/00007 |
| | | | | 428/402 |
| 2013/0018599 | A1* | 1/2013 | Peng | H01L 29/778 |
| | | | | 702/30 |
| 2013/0045530 | A1* | 2/2013 | Gracias | B81C 1/00007 |
| | | | | 435/289.1 |
| 2013/0285018 | A1* | 10/2013 | Yoo | H01L 31/036 |
| | | | | 257/29 |
| 2014/0264275 | A1* | 9/2014 | Zhong | H01L 31/035218 |
| | | | | 257/21 |
| 2014/0320378 | A1* | 10/2014 | Gracias | A61N 5/045 |
| | | | | 343/893 |
| 2014/0368817 | A1* | 12/2014 | Xie | G01N 21/658 |
| | | | | 356/301 |
| 2015/0194540 | A1* | 7/2015 | Kim | H01L 31/036 |
| | | | | 257/29 |
| 2015/0276677 | A1* | 10/2015 | Li | G01N 27/70 |
| | | | | 324/464 |
| 2015/0276709 | A1* | 10/2015 | O'Halloran | C12Q 1/6869 |
| | | | | 506/6 |
| 2015/0369735 | A1* | 12/2015 | Avouris | G01N 21/554 |
| | | | | 356/445 |
| 2016/0305824 | A1* | 10/2016 | Ozyilmaz | G01J 5/34 |
| 2016/0341661 | A1 | 11/2016 | Avouris et al. | |
| 2016/0341662 | A1 | 11/2016 | Avouris et al. | |
| 2016/0341663 | A1 | 11/2016 | Avouris et al. | |
| 2017/0003223 | A1* | 1/2017 | Zubairy | G02B 21/06 |
| 2017/0088944 | A1* | 3/2017 | Sultana | C01B 32/194 |
| 2017/0291819 | A1* | 10/2017 | Cho | C01B 32/23 |
| 2017/0294698 | A1* | 10/2017 | Cho | C23C 28/345 |
| 2017/0352492 | A1* | 12/2017 | Tang | H01G 9/2045 |

OTHER PUBLICATIONS

Feng Liu and Ertugrul Cubukcu, "Tunable omnidirectional strong light-matter interactions mediated by graphene surface plasmons". Physical Review B 88, 115439 (Sep. 2013) (6 pages).

Weigao Xu , Nannan Mao , and Jin Zhang, "Graphene: A Platform for Surface-Enhanced Raman Spectroscopy". Small. 9, pp. 1206-1224 (2013).

Xiaoxia Yang, Zhipei Sun, Tony Low, Hai Hu, Xiangdong Guo, F. Javier García de Abajo, Phaedon Avouris, and Qing Dai, "Nanomaterial-Based Plasmon-Enhanced Infrared Spectroscopy". Adv Mater. 30, 1704896 (2018) (23 pages).

Tony Low and Phaedon Avouris, "Graphene Plasmonics for Terahertz to Mid-Infrared Applications". ACS Nano 8, pp. 1086-1101 (Jan. 2014).

Yilei Li, Hugen Yan, Damon B. Farmer, Xiang Meng, Wenjuan Zhu, Richard M. Osgood, Tony F. Heinz, and Phaedon Avouris, "Graphene Plasmon Enhanced Vibrational Sensing of Surface-Adsorbed Layers". ACS Nano Lett., 14, pp. 1573-1577 (Feb. 2014).

Andrea Marini, Iván Silveiro, and F. Javier García de Abajo, "Molecular Sensing with Tunable Graphene Plasmons". ACS Photonics, 2, pp. 876-882 (Jun. 2015).

Hai Hu, Xiaoxia Yang, Feng Zhai, Debo Hu, Ruina Liu, Kaihui Liu, Zhipei Sun & Qing Dai, "Far-field nanoscale infrared spectroscopy of vibrational fingerprints of molecules with graphene plasmons". Nature Communications, 7:12334 (Jul. 2016) (8 pages).

Daniel Rodrigo, Odeta Limaj, Davide Janner, Dordaneh Etezadi, F. Javier García de Abajo, Valerio Pruneri, & Hatice Altug, "Mid-infrared plasmonic biosensing with graphene". Science. 349, 6244, pp. 165-168 (Jul. 2015).

Damon B. Farmer, Phaedon Avouris, Yilei Li, Tony F. Heinz, and Shu-Jen Han, "Ultrasensitive Plasmonic Detection of Molecules with Graphene". ACS Photonics, 3, pp. 553-557 (Apr. 2016).

Long Ju, Baisong Geng, Jason Horng, Caglar Girit, Michael Martin, Zhao Hao, Hans A. Bechtel, Xiaogan Liang, Alex Zettl, Ron Shen, and Feng Wang, "Graphene plasmonics for tunable terahertz metamaterials". Nature NanoTechnology, 6, pp. 630-634 (Oct. 2011).

Z. Fei, A. S. Rodin, G. O. Andreev, W. Bao, A. S. McLeod, M.Wagner, L. M. Zhang, Z. Zhao, M. Thiemens, G. Dominguez, M. M. Fogler, A. H. Castro Neto, C. N. Lau, F. Keilmann & D. N. Basov, "Gate-tuning of graphene plasmons revealed by infrared nano-imaging". Nature 11253, 487, pp. 82-85 (Jul. 2012).

Zheyu Fang, Yumin Wang, Andrea E. Schlather, Zheng Liu, Pulickel M. Ajayan, F. Javier García de Abajo, Peter Nordlander, Xing Zhu, and Naomi J. Halas, "Active Tunable Absorption Enhancement with Graphene Nanodisk Arrays". ACS Nano Lett., 14, pp. 299-304 (Dec. 2013).

Achim Woessner, Mark B. Lundeberg, Yuanda Gao, Alessandro Principi, Pablo Alonso-González, Matteo Carrega, KenjiWatanabe, Takashi Taniguchi, Giovanni Vignale, Marco Polini, James Hone, Rainer Hillenbrand, and Frank H. L. Koppens, "Highly confined low-loss plasmons in graphene-boron nitride heterostructures". Nature Materials, vol. 14, pp. 421-425 (Apr. 2015).

Marcus Freitag, Tony Low, and Phaedon Avouris, "Increased Responsivity of Suspended Graphene Photodetectors". ACS Nano Lett., 13, pp. 1644-1648 (Mar. 2013).

Bala Murali Venkatesan, David Estrada, Shouvik Banerjee, Xiaozhong Jin, Vincent E. Dorgan, Myung-Ho Bae, Narayana R. Aluru, Eric Pop, and Rashid Bashir, "Stacked Graphene-Al2O3 Nanopore Sensors for Sensitive Detection of DNA and DNA Protein Complexes". ACS Nano, vol. 6, No. 1, pp. 441-450 (Dec. 2012).

Seunghyun Lee , Myung Gwan Hahm , Robert Vajtai , Daniel P. Hashim, Theerapol Thurakitseree , Alin Cristian Chipara , Pulickel M. Ajayan, and Jason H. Hafner, "Utilizing 3D SERS Active Volumes in Aligned Carbon Nanotube Scaffold Substrates". Adv. Mater., 24, pp. 5261-5266 (2012).

Pu Wang , Owen Liang , Wei Zhang , Thomas Schroeder , and Ya-Hong Xie, "Ultra-Sensitive Graphene-Plasmonic Hybrid Platform for Label-Free Detection". Adv. Mater., 25, pp. 4918-4924 (2013).

Juyoung Leem, Michael Cai Wang, Pilgyu Kang, and SungWoo Nam, "Mechanically Self-Assembled, Three-Dimensional Graphene-Gold Hybrid Nanostructures for Advanced Nanoplasmonic Sensors". ACS Nano Lett., 15, pp. 7684-7690 (Oct. 2015).

Daeha Joung, Andrei Nemilentsau, Kriti Agarwal, Chunhui Dai, Chao Liu, Qun Su, Jing Li, Tony Low, Steven J. Koester, and Jeong-Hyun Cho, "Mechanically Self-Assembled Three-Dimensional Graphene-Based Polyhedrons Inducing Volumetric Light Confinement". ACS Nano Lett., 17, pp. 1987-1994 (Feb. 2017).

Jenny Fink, Nicolas Carpi, Timo Betz, Angelique Bétard, Meriem Chebah, Ammar Azioune, Michel Bornens, Cecile Sykes, Luc Fetler, Damien Cuvelier and Matthieu Piel, "External forces control mitotic spindle positioning". Nature Cell Biology, vol. 13, No. 7, pp. 771-778 and supplment (Jul. 2011) (18 pages).

Wang Xi, Christine K. Schmidt, Samuel Sanchez, David H. Gracias, Rafael E. Carazo-Salas, Richard Butler, Nicola Lawrence, Stephen P. Jackson, and Oliver G. Schmidt, "Molecular Insights into Division of Single Human Cancer Cells in On-Chip Transparent Microtubes". ACS Nano 10, pp. 5835-5846 (Jun. 2016).

Abbas Madani, Moritz Kleinert, David Stolarek, Lars Zimmermann, Libo Ma, and Oliver G. Schmidt, "Vertical optical ring resonators fully integrated with nanophotonic waveguides on silicon-on-insulator substrates". Optics Letters, vol. 40, No. 16, pp. 3826-3829 (Aug. 2015).

Shiding Miao, Dechao Chen, Abbas Madani, Matthew R. Jorgensen, Vladimir A. Bolaños Quiñones, Libo Ma , Stephen G. Hickey, Alexander Eychmüller, and Oliver G. Schmidt, "Optofluidic Sensor:

(56) References Cited

OTHER PUBLICATIONS

Evaporation Kinetics Detection of Solvents Dissolved with Cd3P2 Colloidal Quantum Dots in a Rolled-Up Microtube". Adv. Optical Mater., 3, pp. 187-193 (2015).

Sonja M. Weiz, Mariana Medina-Sánchez and Oliver G. Schmidt, "Microsystems for Single-Cell Analysis". Adv. Biosys., 2, 1700193 (2018) (32 pages).

Elliot J. Smith, Sabine Schulze, Suwit Kiravittaya, Yongfeng Mei, Samuel Sanchez, and Oliver G. Schmidt, "Lab-in-a-Tube: Detection of Individual Mouse Cells for Analysis in Flexible Split-Wall Microtube Resonator Sensors". ACS Nano Lett., 11, pp. 4037-4042 (Nov. 2011).

Chunhui Dai, Daeha Joung and Jeong-Hyun Cho, "Plasma Triggered Grain Coalescence for Self-Assembly of 3D Nanostructures". Nano-Micro Lett., 9:27 (Feb. 2017) (10 pages).

Chunhui Dai and Jeong-Hyun Cho, "In Situ Monitored Self-Assembly of Three-Dimensional Polyhedral Nanostructures". ACS Nano Lett., 16, pp. 3655-3660 (May 2016).

Isaac Childres, Luis A. Jaureguib, Wonjun Parkb, Helin Caoa and Yong P. Chen, "Raman Spectroscopy of Graphene and Related Materials", New Developments in Photon and Materials Research (2013) (20 pages).

Sunmin Ryu, Janina Maultzsch, Melinda Y. Han, Philip Kim and Louis E. Brus, "Raman Spectroscopy of Lithographically Patterned Graphene Nanoribbons". ACS Nano, vol. 5, No. 5, pp. 4123-4130 (Mar. 2011).

Mario Hentschel, Martin Schäferling, Xiaoyang Duan, Harald Giessen, and Na Liu, "Chiral plasmonics". Sci. Adv., 3, e1602735 (May 2017) (12 pages).

V. Gusynin, S. Sharapov and J. Carbotte, "Magneto-optical conductivity in graphene". J. Phys.: Condens. Matter, 19, 026222 (Dec. 2006) (26 pages).

George W. Hanson, "Dyadic Green's functions and guided surface waves for a surface conductivity model of graphene". J. Appl. Phys. 103, 064302 (Mar. 2008) (9 pages).

Bin Zhang, Yusheng Bian, Liqiang Ren, Feng Guo, Shi-Yang Tang, Zhangming Mao, Xiaomin Liu, Jinju Sun, Jianying Gong, Xiasheng Guo, & Tony Jun Huang, "Hybrid Dielectric-loaded Nanoridge Plasmonic Waveguide for Low-Loss Light Transmission at the Subwavelength Scale." Sci. Rep., 7, 40479, pp. 1-9 (Jan. 2017).

Yurui Fang and Mengtao Sun, "Nanoplasmonic waveguides: towards applications in integrated nanophotonic circuits." Light: Science & Applications, 4, e294, pp. 1-11 (Jun. 2015).

Pierre Berini, "Figures of merit for surface plasmon waveguides". Opt. Express, vol. 14, No. 26, pp. 13030-13042 (Dec. 2006).

Youjun Zenga, Rui Hua, Lei Wang, Dayong Gu, Jianan He, Shu-Yuen Wu, Ho-Pui Ho, Xuejin Li, Junle Qu, Bruce Zhi Gao and Yonghong Shao, "Recent advances in surface plasmon resonance imaging: detection speed, sensitivity, and portability". Nanophotonics, 6(5), pp. 1017-1030 (2017).

Stefan M. Harazim, Vladimir A. Bolanos Quinones, Suwit Kiravittaya, Samuel Sanchez and Oliver G. Schmidt, "Lab on a chip". Lab Chip, 12, pp. 2649-2655 (May 2012).

Borwen You, Ja-Yu Lu, Chin-Ping Yu, Tze-An Liu, and Jin-Long Peng, "Terahertz refractive index sensors using dielectric pipe waveguides". Opt Exrpess, vol. 20, No. 6, pp. 5858-5866 (Feb. 2012).

Yunjung Kim, Sunkyu Yu & Namkyoo Park, "Low-dimensional gap plasmons for enhanced light-graphene interactions". Sci. Rep. 7, 43333 (Feb. 2017) (7 pages).

Niladri Patra, Boyang Wang, and Petr Kra'l, "Nanodroplet Activated and Guided Folding of Graphene Nanostructures". Nano Letters, vol. 9, No. 11, pp. 3766-3771 (Oct. 2009).

Tao Deng, ChangKyu Yoon, Qianru Jin, Mingen Li, Zewen Liu, and David H. Gracias, "Self-folding graphene-polymer bilayers". Appl. Phys. Lett. 106, 203108 (May 2015) (5 pages).

Marc Z. Miskina, Kyle J. Dorseyc, Baris Bircan, Yimo Han, David A. Mullera, Paul L. McEuena, and Itai Cohena, "Graphene-based bimorphs for micron-sized, autonomous origami machines". PNAS, vol. 115, No. 3, pp. 466-470 (Jan. 2018).

Joyce Breger, Dongyeon Helen Shin, Kate Malachowski, Shivendra Pandey, and David H. Gracias, "Origami-Inspired 3D Assembly of Egg-Crate Shaped Metamaterials Using Stress and Surface Tension Forces". MRS Advances, pp. 1743-1748 (2015).

\* cited by examiner

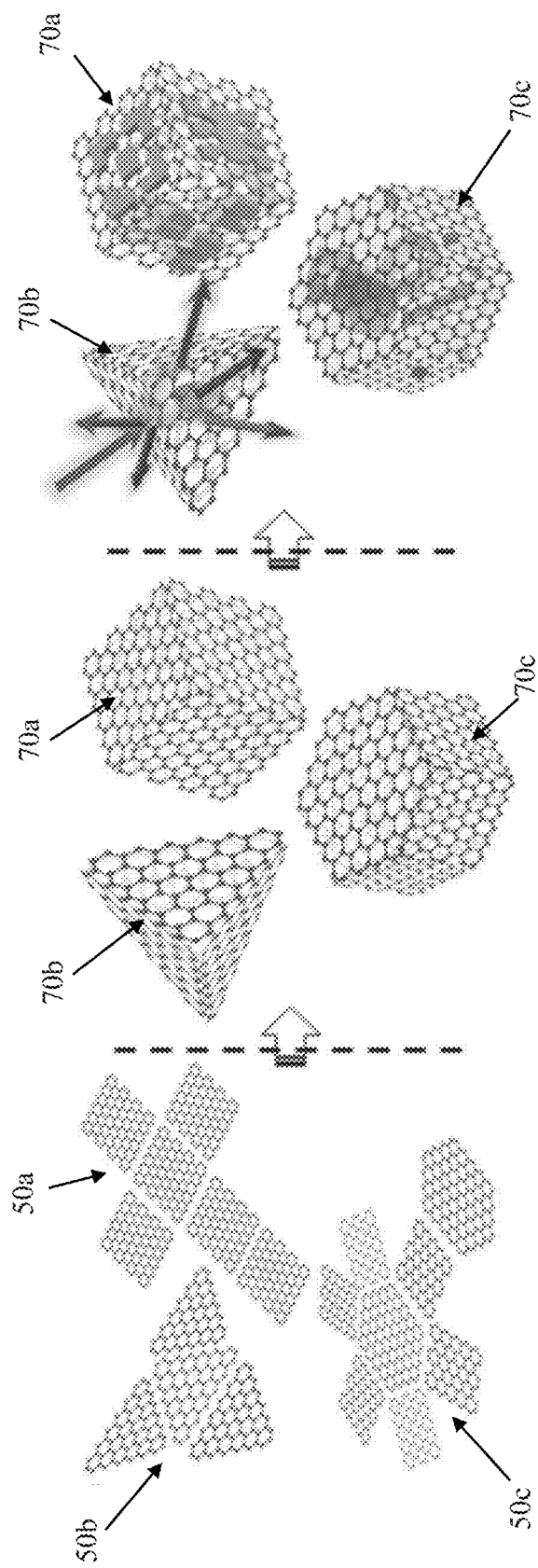

Scale bar = 200 μm

Scale bar = 200 μm

Comparison of the D, G, and 2D bands of 2D and 3D graphene-based structures (cm$^{-1}$)

|  | D band | G band | 2D band | $I_D/I_G$ |
| --- | --- | --- | --- | --- |
| Pristine graphene | N/A | 1587.6 | 2690.3 | N/A |
| 2D graphene before self-assembly | 1342.9 | 1580.9 | 2690.1 | 0.52 |
| 3D graphene | 1338.8 | 1576.9 | 2683.1 | 0.65 |

3D GRAPHENE OPTICAL SENSORS AND METHODS OF MANUFACTURE

CROSS-REFERENCE TO RELATED APPLICATIONS

This Non-Provisional Patent Application claims the benefit of the filing date of U.S. Provisional Patent Application Ser. No. 62/609,813, filed Dec. 22, 2017, the entire teachings of which are incorporated herein by reference.

GOVERNMENT SUPPORT CLAUSE

This invention was made with government support under CMMI-1454293 awarded by the National Science Foundation. The government has certain rights in the invention.

BACKGROUND

Two-dimensional ("2D") materials, such as graphene, transition metal dichalcogenides ("TMDC"s) and black phosphorus, possess extraordinary electronic, optical, mechanical, and permeation properties, making them model systems for the observation of a novel physical phenomenon and building blocks for future devices. For example, graphene has been viewed as being well-suited for sensor applications as graphene's large surface-to-volume ratio, optical properties, electrical conductivity and other attributes are beneficial for sensor functions. Use of graphene structures in biosensors and diagnostic sensor applications holds great promise. As a point of reference, when graphene-based structures have light incident on them, a strong drop in transmission is seen at their resonance frequency. In the presence of foreign materials, particles or molecules, this resonance frequency changes according to the properties of the material it is exposed to. Nanoscale particles or molecules cannot provide a large enough shift in frequency to be detected unless present in large quantities. At the resonance, the graphene-based structures also enhance the electric field in the surrounding area. This enhancement increases the intensity of the light absorbed by the foreign particle, and thus allows the detection of nanoscale molecules with a much higher sensitivity.

Graphene sensors have been developed utilizing 2D nanoribbons. These 2D nanoribbon graphene sensors have very low field enhancement away from the sensor's surface, requiring the to-be-sensed molecules to be tethered to the surface. This, in turn, limits the sensing area and the sensitivity of the sensor structures. Sticking the molecules to the surface can also modify the property of the molecule; this effect is not desired in biological samples. It also requires use of an antibody that acts as a "glue" to stick the molecules to the surface and needs to be constantly replenished. Since the field in 2D ribbons decays rapidly away from the sensor's surface, the probability of detecting a molecule of interest is directly proportional to the likelihood of the molecule adhering to the sensor's surface as the fluid in which the molecule is entrained flows by. This limits the ability of 2D nanoribbon graphene sensors to detect molecules of interest.

Sensors using graphene stacks and nanoribbon arrays have been considered that produce a higher field enhancement than the single 2D ribbon. Plasmonic effects in graphene can arise when it is patterned into micro- and nano-structures. The 2D graphene arrays produce resonance with multiple peaks that are spectrally very broad, giving them low quality factors. The shift in waveform of 3D arrays is thus difficult to monitor since the resonance with foreign materials may overlap with secondary peaks that were caused by a non-uniform 2D coupling. The wide resonance peaks also mean that the sensitivity is limited and the sensors cannot be used for low concentration sensing applications. Graphene stacks use a second material between individual layers, and it is in this area that the highest field exists. However, the high enhancement between the layers is not accessible to the molecules being detected because the secondary material (usually a dielectric) fills it out. Further, sensors utilizing a graphene nanoribbon array and or graphene stack still require sticking of the molecule to-be-sensed to the high enhancement area.

The plasmonic field enhancement is directly proportional to the intensity of the photons that will be absorbed by the targeted molecules for sensing applications, and thus can be an important parameter in determining the viability of graphene for ultrasensitive molecular sensors.

SUMMARY

The present disclosure addresses one or more of the above concerns.

Some aspects of the present disclosure are directed toward 3D graphene optical sensors, such as microstructure sensors and nanostructure sensors. The 3D optical sensors include one or more panels shaped to surround an interior, open volume and including a graphene membrane. Graphene plasmons couple across the interior, open volume. In some embodiments, the 3D optical sensor is a micro- or nanocylinder (e.g., half-way curved micro- or nanocylinder, nearly completely curved micro- or nanocylinder, completely curved micro- or nanocylinder). In other embodiments, the 3D optical sensor is a micro- or nanostructure having a polyhedral shape. The polyhedral shape can be defined by a plurality of panels interconnected by hinges. Each of the panels includes a graphene membrane supported by a frame. In some embodiments, a metal pattern can be applied to the membrane of at least one of the panels. In some embodiments, the hinges are formed of a polymer material, for example a polymer material having a low reflow temperature (e.g., not greater than 100° C.).

Other aspects of the present disclosure are directed toward methods of making a microscale or nanoscale, free-standing, 3D, hollow, graphene optical sensor using a self-folding approach. This approach allows for the fabrication of a 3D structure with both vertical and horizontal free-standing graphene 2D material that does not require additional support or substrate. Methods include forming a 2D net on a substrate. The 2D net includes at least one panel having a frame supporting a graphene membrane. The 2D net is subjected to thermal energy, causing the 2D net to self-transition into a 3D graphene sensor having an interior, open volume. Graphene plasmons couple across the interior, open volume. In some embodiments, the 2D net is a single panel including bottom and top protection layers sandwiching the graphene membrane, and a sacrificial layer disposed over the top protection layer. When subjected to thermal energy, the sacrificial layer melts and generates surface tension forces to curve the 2D net into a 3D cylinder. In other embodiments, the 2D net including a plurality of panels interconnected by hinges. Each panel includes a graphene membrane supported by a frame. In some embodiments, a material of the hinges is a polymer. When partially or completely released from the substrate and heated, the hinges reflow or melt, causing self-assembly or transition from the 2D structure to a 3D structure. The 3D optical sensors are created in a way that allows retention of the graphene material's intrinsic properties.

An optional advantage of some methods of the present disclosure is the 3D modification of graphene membrane by 3D patterning. As a result, the self-assembly process of the present disclosure not only offers control of size and shape, allowing for fabrication of free-standing, hollow structures, but also allows for patterning with a different combination of metal, semiconductor, and insulator materials on the 2D materials. Thus, a complex optical and electronic integration in a 3D architecture can be realized for applications in next generation optoelectronic devices.

In accordance with some aspects of the present disclosure, methods have been developed for building free-standing, hollow, 3D, polyhedral graphene micro/nanostructures with 3D surface patterning that functionalize the 3D structures without sacrificing the intrinsic properties of the 2D materials. The 3D graphene structure induces uniform plasmon-plasmon couplings at each of the faces in the 3D that features spectrally isolated resonance modes and non-trivial spatial distribution of the electric field of this mode. The present disclosure provides the ability to sculpt the interaction of graphene with light through 3D structural engineering reveals the new degree of freedom to design desirable optical properties of materials for physics, chemistry, and devices. Furthermore, 3D cubes can be constructed with the use of other 2D materials such as transition metal dichalcogenides and black phosphorus with various surface patterning with metal, semiconductor, and insulator patterns.

Some methods of the present disclosure realize multi-faced 3D micro- and nanocubes with 2D graphene by using self-folding, which overcomes the foremost challenges in the construction of multi-faced, free-standing, hollow, enclosed, 3D, polyhedral, graphene materials, with the use of polymer SU-8 or aluminum oxide ($Al_2O_3$) frames. The self-folding approach allows heterogeneous integrations with control of size and shape, and various materials which can produce free-standing, 3D, multifunctional devices. Also, some methods of the present disclosure allows for surface modifications by realizing metal patterning on the 3D faces. In addition, a high degree of volumetric light confinement induced by rich 3D plasmonic hybridization behavior arising from the coupling between interfacial plasmonic modes in graphene in accordance with the present disclosure. Hence, this dimensional extension from 2D to 3D offers a new way to sculpt light-on-demand.

BRIEF DESCRIPTION OF THE DRAWINGS

FIGS. 3A-3C schematically illustrate differently shaped 2D nets and 3D sensors in accordance with principles of the present disclosure;

DETAILED DESCRIPTION

Figure 1:
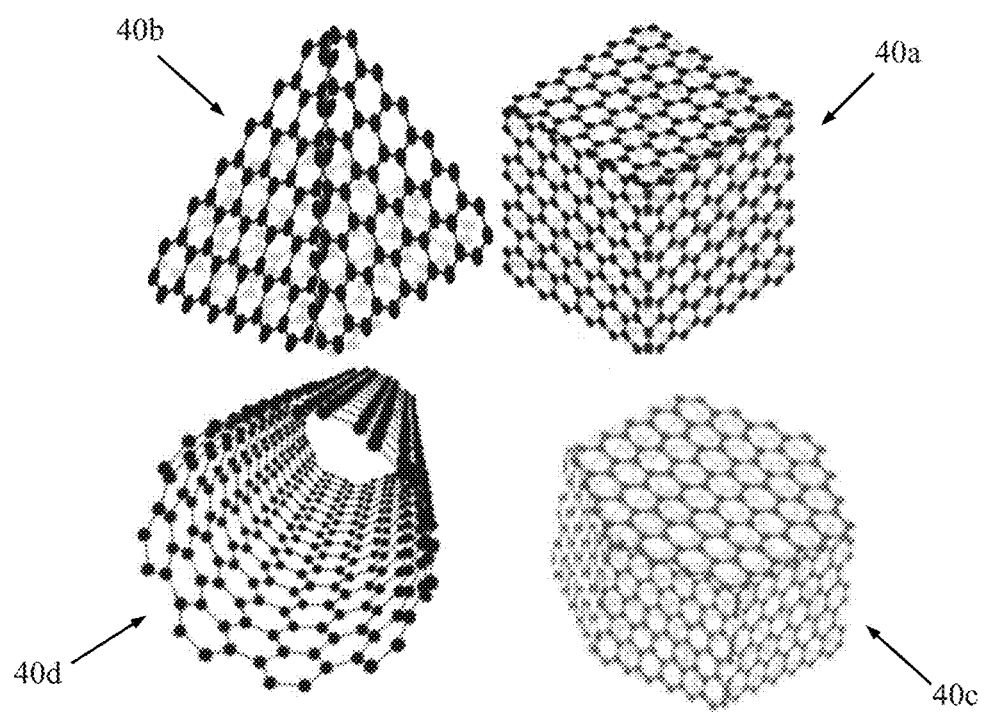
FIG. 1 provides perspective views of 3D graphene micro- or nanostructure sensors in accordance with principles of the present disclosure.

Aspects of the present disclosure are directed toward micro- and nanoscale, free-standing, 3D graphene optical sensors, methods of manufacture, and testing systems and methods utilizing the sensors. In general terms, the microscale and nanoscale 3D graphene sensors of the present disclosure include one or more panels shaped to surround an interior, open volume and including a graphene membrane. Some non-limiting examples of 3D graphene sensors of the present disclosure are shown in FIG. 1. The 3D graphene sensors can have a polyhedral shape (e.g., cubic micro- or nanoscale 3D graphene sensor 40a, triangle pyramid micro- or nanoscale 3D graphene sensor 40b, hexagonal pyramid micro- or nanoscale 3D graphene sensor 40c) or a tubular shape (e.g., right circular hollow cylinder micro- or nanoscale 3D graphene sensor 40d), and can have a closed or open-sided construction. Regardless of an exact shape, plasmons of the graphene membrane(s) are coupled across the interior, open volume as described in greater detail below.

Fabrication methods of the present disclosure are configured to retain physical and chemical properties of the graphene membrane(s) throughout the fabrication process, and in some embodiments incorporate a self-assembly process as described below.

A1. Methods of Manufacture: Micro- or Nanoscale Polyhedral Graphene Sensor

Figure 2A:
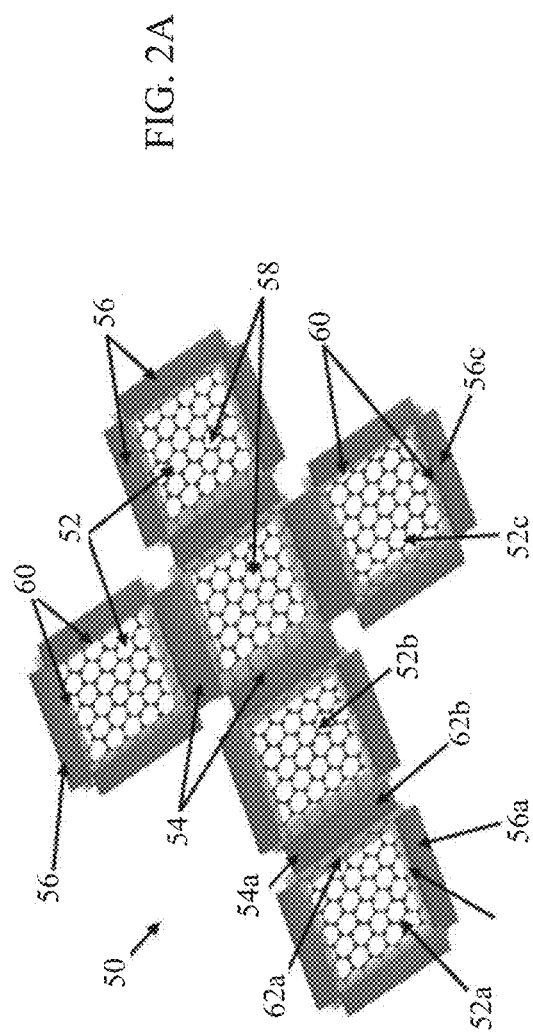
FIG. 2A is a simplified perspective view of a 2D net of graphene panels useful in forming a 3D graphene optical sensor in accordance with principles of the present disclosure.

In some embodiments, an origami-like self-folding manufacturing approach is employed to fabricate any of the polyhedral shaped micro- or nanoscale 3D graphene sensors disclosed herein. For example, FIG. 2A illustrates a 2D net 50 from which a 3D microscale polyhedral (e.g., tubular, cubic, etc.) graphene optical sensor of the present disclosure can be generated. The 2D net 50 includes a plurality of microscale panels 52, hinges 54, and optional joint structures 56. Each of the panels 52 includes a graphene membrane 58 and a frame 60. Optionally, one or more of the panels 52 can be functionalized (e.g., a metal pattern is applied to the corresponding membrane 58). Exemplary constructions of the graphene membrane 58 and the frame 60 are provided below. In general terms, the frame 60 physically supports the corresponding graphene membrane 58 and can be formed of various materials, such as polymer (e.g., epoxy), metal (e.g., nickel), insulators (e.g., $Al_2O_3$), polymer (e.g., a photoresist), etc. Respective ones of the hinges 54 extend between and interconnect opposing edges of immediately adjacent ones of the panels 52 in the array of the 2D net 50. A material of each of the hinges 54 is selected to exhibit desired properties when subjected to an environmental changes, such as in the presence of heat (e.g., molten, surface tension force, reflow), and in some embodiments is a polymer (e.g., photoresist), solder (Pb—Sn), etc. As initially provided in the form of the 2D net 50, the panels 52 are arranged in an array conducive to folding into a 3D polyhedral shape, with facing edges of immediately adjacent ones of the panels 52 being connected to one another by a corresponding one of the hinges 54. Stated otherwise, in the 2D net array, various panels 52 are arranged side-by-side or edge-to-edge; one of the hinges 54 extends between and interconnects the corresponding edges thereof. For example, first and second panels 52a, 52b are identified in FIG. 2A. In the array, the first panel 52a is immediately adjacent the second panel 52b, with a first edge 62a (referenced generally) of the first panel 52a facing or immediately proximate a first edge 62b of the second panel 52b. The first and second panels 52a, 52b are interconnected by a hinge 54a that extends between the first edges 62a, 62b. Other panel edges in the array of the 2D net 50 are free or not otherwise directly connected to another panel by a hinge. For example, a second edge 64a of the first panel 52a identified in FIG. 2A is not directly connected to a separate panel in the 2D net 50 state. In some embodiments, a joint structure 56 is provided at one or more (including all) of the panel free edges. Where provided, the joint structure 56 projects beyond the face of the corresponding panel 52 (e.g., FIG. 2A identifies joint structure 56a that is applied to the first panel 52a at the second edge 64a). A material of each of the joint structures 56 can be identical to that of the hinges 54 (e.g., polymer) for reasons made clear below.

Figure 2B:
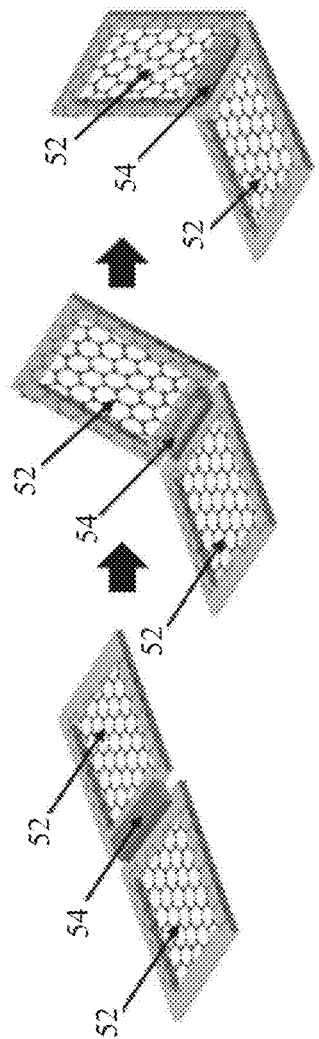
FIG. 2B schematically illustrates some methods of the present disclosure.
Figure 2C:
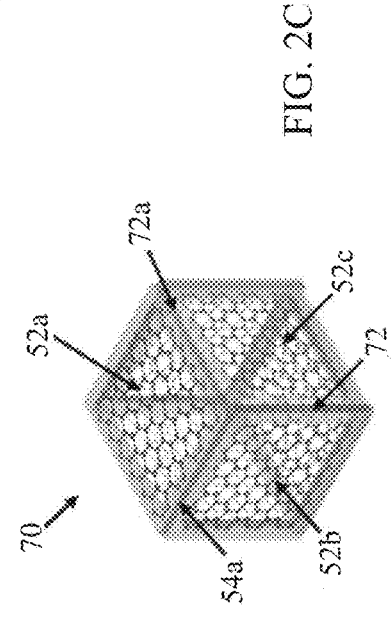
FIG. 2C is a simplified perspective view of a 3D graphene microstructure resulting from the 2D net of FIG. 2A.

In some embodiments, the 2D net 50 is configured such that when the 2D net 50 is subjected to heat, the molten hinges 54 generate a surface tension force and causes the panels 52 to self-fold up into a 3D microscale structure (e.g., as a result of the polymer hinge melting (or reflow), a surface tension force is generated). For example, FIG. 2B schematically depicts self-folding of the hinge 54 and two of the panels 52 when the hinge 54 is subjected to heat. FIG. 2C illustrates a 3D graphene sensor 70 resulting from origami-like self-folding of the 2D net 50. As a point of reference, and with additional reference to FIG. 2A, where provided, various ones of the joint structures 56 are brought into contact with one another and fuse upon self-folding of the 2D net 50, resulting in a completed joint 72 at a corresponding edge of the 3D microstructure 70. For example, the first joint structure 56a is identified with the first panel 52a in FIG. 2A, as is a first joint structure 56c provided with a third panel 52c. The first-third panels 52a-52c are again labeled in FIG. 2C, along with the hinge 54a. With cross-reference between FIGS. 2A and 2C, one completed joint 72a of the 3D optical sensor 70 is generated by the first joint structure 56a of the first panel 52a and the first joint structure 56c of the third panel 52c upon completion of the self-folding operation.

The 2D net and resultant polyhedral 3D sensors of the present disclosure can assume a wide variety of other shapes, such as any polyhedral shape, and are not limited to the cubic shape of FIG. 2C. For example, FIGS. 3A and 3B schematically illustrate conversion of 2D nets 50a, 50b, 50c into 3D graphene sensors 70a, 70b, 70c of various 3D shapes. FIG. 3C schematically illustrates that the sensors 70a, 70b, 70c of the present disclosure can be functionalized by surface patterning and/or encapsulating various materials (e.g., chemicals, biomaterials, etc.). Further, while in some embodiments, the 3D graphene optical sensors of the present disclosure have a closed shape (e.g., the hollow, six sided cubic shape of the sensor 70 in FIG. 2C), in other embodiments an open shape can be provided (e.g., a four sided, tubular-like (or open box) shape akin to the sensor 70 of FIG. 2C except that two opposing panels 42 are omitted, permitting fluid flow through an interior volume of the sensor shape).

Figure 4:
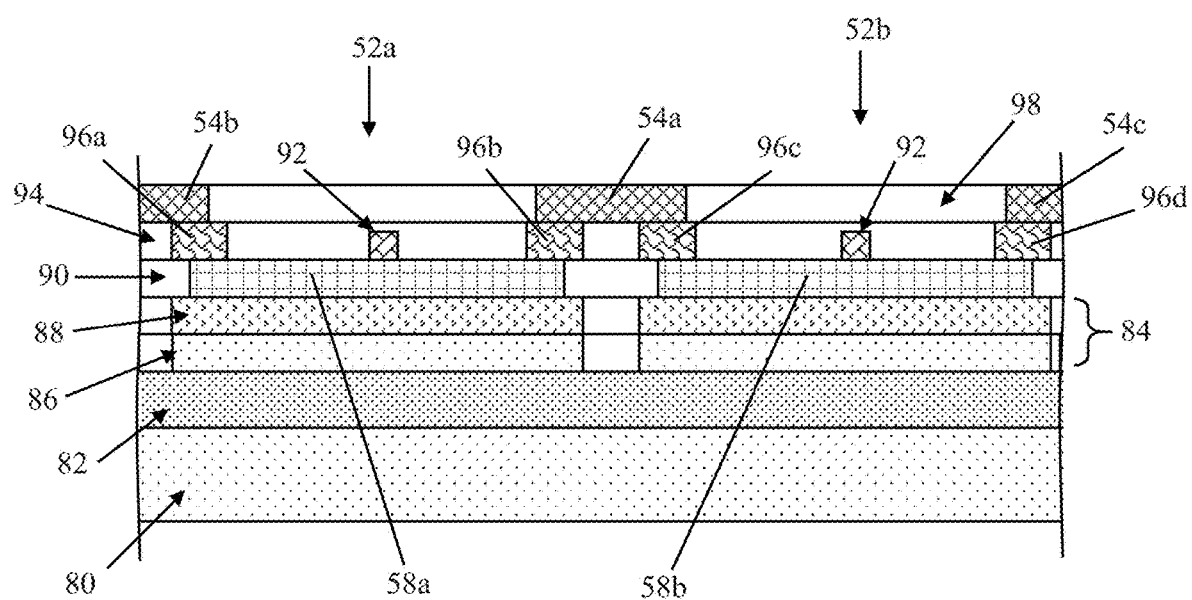
FIG. 4 is a simplified cross-sectional view illustrating fabrication of a 2D net in accordance with principles of the present disclosure.

With additional reference to FIG. 4, in some embodiments, fabrication of the 2D net 50 can include providing or forming a base substrate 80 coated with a sacrificial layer 82. The base substrate 80 can assume various forms, and in some embodiments is silicon, for example a silicon wafer. The sacrificial layer 82 can also have various constructions conducive to the methods below, and in some embodiments is copper (Cu). A patterned protection layer 84 is then formed over the sacrificial layer 82. The patterned protection layer 84 can assume various forms for protecting other, later-applied material (e.g., graphene) from chemical, stress, etc., and in some embodiments includes a first sub-layer 86 deposited onto the sacrificial layer 82, and a second sub-layer 88 deposited onto the first sub-layer 86. The first sub-layer 86 can be chromium (Cr) and the second sub-layer 88 can be aluminum oxide ($Al_2O_3$), although other materials and constructions are envisioned. In other embodiments, the patterned protection layer 64 can consist of a single material layer, or can include three or more sub-layers. Regardless, a shape of the patterned protection layer 84 corresponds with the desired shape of the 2D net 50, and can include various features for supporting later-applied materials. For example, the first and second sub-layers 86, 88 can be defined using photolithography and lift-off procedure.

The graphene membranes 58 are then formed onto the protection layer 84. As a point of reference, in the simplified cross-sectional view of FIG. 4, a membrane pattern 90 is identified generally; cross-hatching provided in the representation of the membrane pattern 90 indicates two, spaced apart membranes 58a, 58b. Commensurate with the descriptions above, each of the membranes 58a, 58b corresponds with a to-be-completed panel that are generally labeled in FIG. 4 as the panels 52a, 52b, respectively. The membranes 58 can be generated by applying or transferring the membrane pattern 90 and then removing unwanted portions of the membrane pattern 90 to define the individual membranes (e.g., by a combination of photolithography and oxygen plasma treatment). The membranes 58 are a graphene material.

In some non-limiting embodiments, the graphene membranes 58 can prepared by chemical vapor deposition techniques (CVD graphene). Each of the graphene membranes 58 can include a plurality of 2D graphene layers or sheets. For example, each membrane 58 can consist of two or more 2D graphene layers, for example three, ten, etc., 2D graphene layers.

For example, single layers of CVD graphene can be synthesized on copper foil. After growth, a thin coating of poly(methyl methacrylate) (PMMA) can be applied to the single layer of graphene on the foil (e.g., spin coated). The copper foil is then removed/etched, and the floating PMMA-coated graphene layer is transferred onto the protection layer 94. The PMMA coating is then removed (e.g., acetone). Where desired, additional single layers of graphene can be transferred onto a previously-transferred graphene layer to complete the membrane 58.

In some embodiments, surface modifications or functionalizing steps can optionally be performed onto one or more or all of the graphene membranes. For example, patterns 92 (drawn generally) as desired can be formed. The patterns 92 can assume various forms, and in some embodiments are each a desired or selected circuitry pattern. In some embodiments, then, a material of the patterns 92 is metal (e.g., titanium (Ti), aluminum (Al), etc.). The individual patterns 92 applied to individual ones of the membranes 58 can be identical or different. In other embodiments, the patterns 92 can be omitted.

The frames 60 (FIG. 2A) can then be formed onto the membranes 58. As a point of reference, in the simplified cross-sectional view of FIG. 4, a frame pattern 94 is identified generally; cross-hatching provided in the representation of the frame pattern 94 indicates first and second frame segments 96a, 96b associated with the first membrane 58a; though not shown in FIG. 4, the first and second frame segments 96a, 96b are interconnected in forming a completed frame of the first panel 52a). First and second frame segments 96c, 96d are similarly illustrated as being associated with the second membrane 58b and form parts of the completed frame of the second panel 52b. The second frame segment 96b of the first panel 52a is proximate, but spaced from, the first frame segment 96c of the second panel 52b. A material of the frame pattern 94 (and thus of the frames) can assume various forms, and in some embodiments is an epoxy, such as the photodefinable epoxy SU-8. The frame pattern 94 can be formed by conventional lithography techniques. Other materials are also envisioned, such as insulating materials including $Al_2O_3$.

The hinges 54 can then be formed over the so-generated frames 60, interconnecting the frames segments of immediately adjacent panels. As a point of reference, in the simplified cross-sectional view of FIG. 4, a hinge pattern 98 is identified generally; cross-hatching provided in the representation of the hinge pattern 98 indicates a first hinge 54a interconnecting the second frame segment 96b of the first panel 52a and the first frame segment 96c of the second panel 52b. Portions of second and third hinges 54b, 54c are also shown. A material of the hinge pattern 98 (and thus of the hinges 54) can be a polymer, such as a polymer-based photoresist film available under the trade designation SPR 220. Other materials are also envisioned, such as poly (methyl methacrylate) (PMMA), and the hinge pattern 78 can be formed using known techniques appropriate for the particular material selected.

The 2D net 50 is then removed from the base substrate 80 and the sacrificial layer 82, for example by dissolving the sacrificial layer 82 in an appropriate etchant. The released 2D net 50 is then heated to the melting point of the hinges 54 (e.g., with some polymer hinge constructions, the released 2D net 50 can be placed in water heated to approximately 100-170° C. (depending upon the selected material for the hinges 54)). As a result of the hinges 54 melting (or reflow), a surface tension force is generated, inducing the self-assembly process described above that transforms the 2D net 50 into a 3D structure. Finally, the protection layer 84 is removed, for example by an appropriate etchant, completing the 3D graphene optical sensor.

With the above methods and variations thereof, the frames 60 (e.g., a photodefinable epoxy material) support the graphene membranes 58. The advantages of using the frames 40 can include: (i) realization of the 3D structure with pristine CVD graphene without chemical reaction; (ii) realization of surface patterning with metals or semiconductors to induce a new physical property; (iii) easy control of size (nm to mm) and shapes (any polyhedron) of the 3D structures, and easy control of the folding angle of the 3D structure for the realization of diverse 3D structures including semi-3D structures; (iv) realization of multifaced polyhedral structures for multiple optical reflections, resulting in an optical switching behavior; (v) control of the precise position of the structures (or devices), resulting in a well-aligned array for optical characterization; and (vi) realization of well-defined four- or five-faced open cubic (or void) structures, which can be used, for example, for fluidic sensors.

The above methodologies can be useful to generate 3D graphene optical sensors of a size on the order of 100 s of μm. Even smaller sized 3D graphene optical sensors in accordance with principles of the present disclosure are also envisioned, such as by in situ monitored self-assembly process using a focused ion-beam microscopy described in Dai, C. et al., Nano Lett. 2016, 16, 3655 the entire teachings of which are incorporated herein by reference.

Figure 5A:
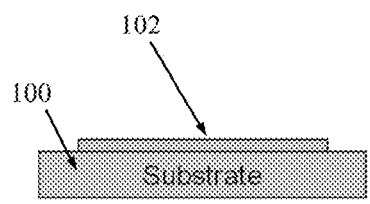
FIGS. 5A-5F illustrate methods of making a 3D graphene optical sensor in accordance with principles of the present disclosure.
Figure 5B:
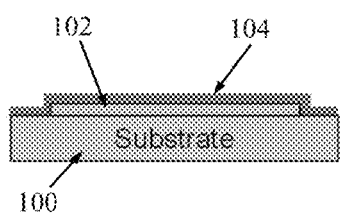
Figure 5C:
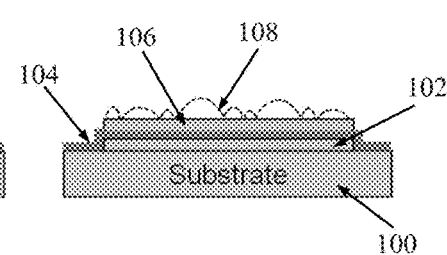
Figure 5D:
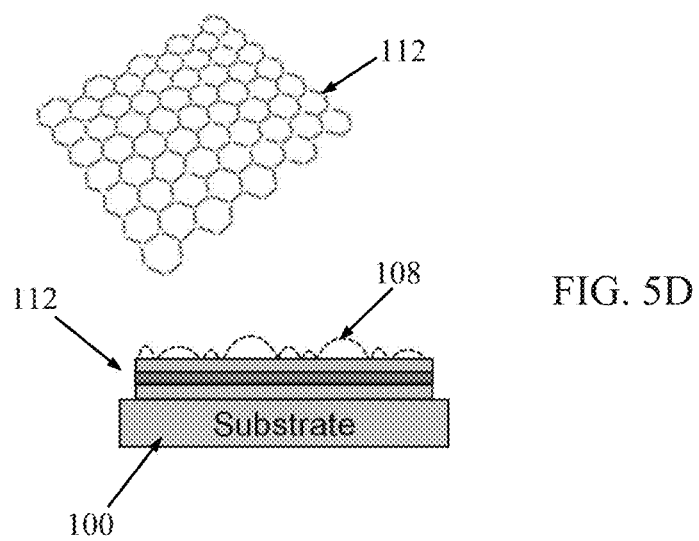
Figure 5E:
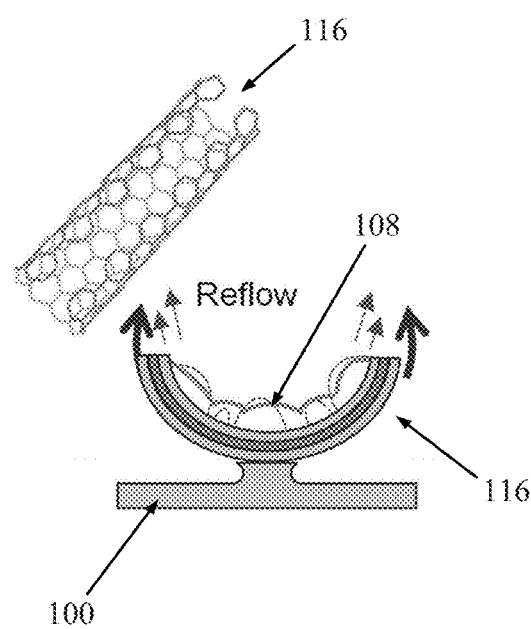
Figure 5F:
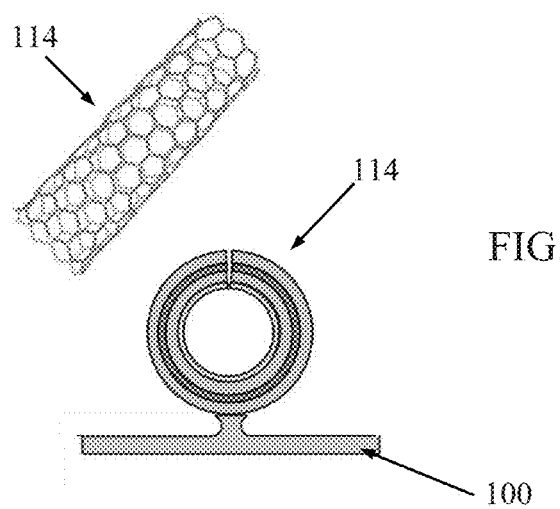

A2. Methods of Manufacture: Micro- or Nanoscale Tubular or Cylindrical Graphene Sensor In other embodiments, the 3D graphene optical sensors of the present disclosure can be a 3D, open-ended tube or cylinder, optionally formed by a self-assembly process. For example, and with reference to FIG. 5A, a substrate 100 (e.g., silicon) is provided and onto which a bottom protection layer or frame 102 (e.g., aluminum oxide) is formed (e.g., deposited). A graphene layer 104 is formed over the bottom protection layer 102 as shown in FIG. 5B. In some embodiments, the graphene layer 104 is transferred on top of the bottom protection layer 102 by a wet transfer process. A patterned negative photoresist (e.g., N2403) is formed (e.g., spun) on top of the graphene layer 104, and serves to protect the graphene from electron irradiation for the rest of the process (e.g., EBL process). Then a secondary array of 2D ribbons with the same dimensions are formed or defined on the photoresist that is aligned precisely to the bottom protection layer 102. The unexposed photoresist is then dissolved or removed, such as by an appropriate developer solution (e.g., MF 319). As shown in FIG. 5C, a top protection layer or frame 106 (e.g., aluminum oxide) is formed (e.g., deposited) over the secondary array of 2D ribbons and graphene 104, and a sacrificial layer 108 (e.g., tin) is formed (e.g., deposited) over the top protection layer 106. Those portions 110 of the graphene layer 104 not otherwise protected by the top protection layer 106 and the sacrificial layer 108 are then removed, such as by an oxygen plasma treatment in a reactive ion etching system, resulting in a 2D sandwiched graphene ribbon or net 112 as shown in FIG. 5D. With reference to FIGS. 5E and 5F, the sandwiched graphene ribbon 112 is caused to self-assemble into a 3D tube 114. For example, a reactive ion etching can be performed (e.g., reactive ion etching with $CF_4/O_2$). During this process, both the chemical reaction between the fluorine atoms and the substrate 100 (e.g., silicon) and the physical ion bombardment on the substrate 100 can contribute for etching the substrate 100 beneath the sandwiched graphene ribbon 112. As a result, the graphene sandwiched structure will be released from the substrate 100, reflected by the intermediate, folding or curving shape 116 in FIG. 5E. Simultaneously, both the physical and chemical reactions can generate thermal energy that can melt the sacrificial layer 108 (e.g., tin), in turn triggering grain coalescence. As a result of grain coalescence, a surface tension force will be induced in the film/graphene ribbon 112, curving the 2D graphene ribbon 112 out of plane and, with further self-assembly time, to form the 3D graphene nanotube or nanocylinder 114 (as shown in FIG. 5F).

Figures 6A, 6B, 6C:
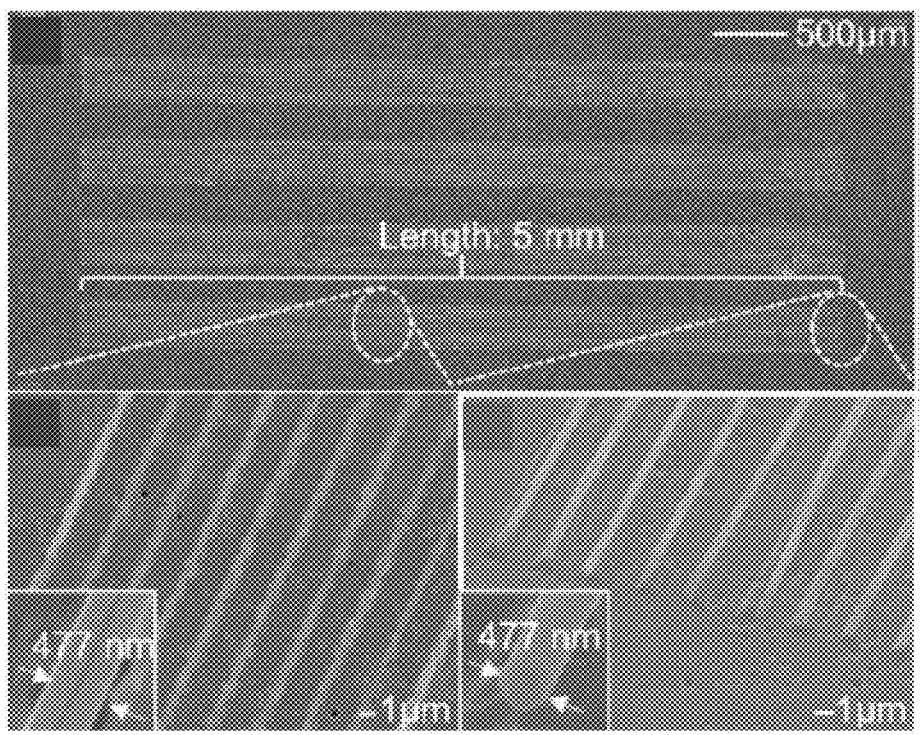
FIG. 6A is an SEM image of 3D graphene nanocylinder optical sensors in accordance with principles of the present disclosure.
FIG. 6B is an enlarged image of a middle region of one of the 3D graphene nanocylinders of FIG. 6A.
FIG. 6C is an enlarged image of an end region of one of the 3D graphene nanocylinders of FIG. 6A.

The shape of the self-assembled graphene-based tubular nanostructure can optionally be further controlled via tuning the design of the 2D graphene structure. By way of non-limiting example, patterning a graphene ribbon with dimensions of 1.5 μm×5 mm, graphene-based nanocylinders with a diameter of 477 nm and a high aspect ratio (i.e., ratio of the length to the diameter) of around 10,000 can be achieved. By way of further example, FIG. 6A is an SEM image of several graphene-based nanocylinders fabricated in accordance with some methods of the present disclosure, each having a length on the order of 5 mm and a diameter on the order of 500 nm. FIGS. 6B and 6C are SEM images showing the zoomed-in image of the middle (FIG. 6B) and end (FIG. 6C) of the long nanocylinders of FIG. 6A. A comparison of FIGS. 6B and 6C reveals that methods of the present disclosure can generate uniform self-assembly throughout the resultant graphene nanocylinder. FIGS. 6B and 6C reflect that even though the length of the self-assembled nanocylinder is in millimeter scale, the two edges (of the initial 2D graphene ribbon) closely touch each other throughout the entire length of the resultant graphene nanocylinder. Moreover, the self-curving processes of the present disclosure are feasible for fabricating 3D graphene nanocylinders of various other dimensions. Excluding the limitations of the size of the graphene sheets and the abilities of the EBL process, there essentially is no limit to the length of the 3D graphene nanocylinders of the present disclosure. By increasing the length of the 2D design, 3D graphene nanocylinders with significantly higher aspect ratios can be achieved.

Figure 7A:
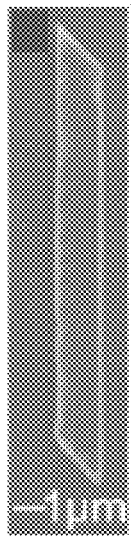
FIG. 7A is an SEM image of a 2D graphene nanoribbon.
Figure 7B:
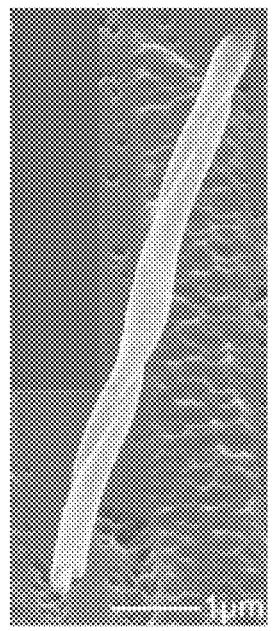
FIG. 7B is an SEM image of a 3D graphene twisted nanocylinder generated from the 2D graphene nanoribbon of FIG. 7A in accordance with principles of the present disclosure.

In related embodiments, twisted graphene-based nanocylinders can also be realized by designing the 2D graphene ribbon with beveled edges. FIGS. 7A and 7B are SEM images of a graphene-based twisted nanocylinder before (FIG. 7A) and after (FIG. 7B) self-assembly. With self-assembly methods described above, because the etching rate is isotropic along the outline of the 2D ribbon, the sharp corner of the beveled 2D ribbon is released and start folding or curving before other regions of the 2D ribbon. Thus, a diagonal folding or curving trend is initiated from the sharp corner, which in turn dictates the folding direction of the entire structure. With further etching, the remainder of the graphene-based ribbon is released and folds up along the initial folding direction, resulting in a twisted graphene-based nanocylinder.

B. Volumetric Light Confinement

Returning to FIG. 1, regardless of an exact shape of the polyhedral 3D graphene optical sensor 40a-40c, plasmons of the graphene membranes (e.g. the graphene membranes 58 of FIGS. 2A-2C) are coupled to one another. A high degree of volumetric light confinement induced by rich 3D plasmonic hybridization behavior arises from the coupling between interfacial plasmonic modes in graphene. The 3D graphene optical sensors of the present disclosure offer new ways to sculpt light-on-demand, providing optical sensing capabilities not previously available. As a point of reference, the detection of a target by an optical sensor is to a large degree determined by its spatial overlap with the excitation optical fields. Particularly, for high sensitivity, it is necessary to increase the sensing area to the entire volume of the targeted substances in order to detect very minute concentrations of the target that may be far away from the sensor surface. Thus, a very strong electric field extending into the bulk of the substance containing the target is required for ultra-sensitive detection. This concept is realized by the present disclosure in transforming 2D graphene into 3D graphene structures, which generate volumetric light confinement induced by 3D plasmon hybridization in the 3D graphene sensor structure.

Figure 8:
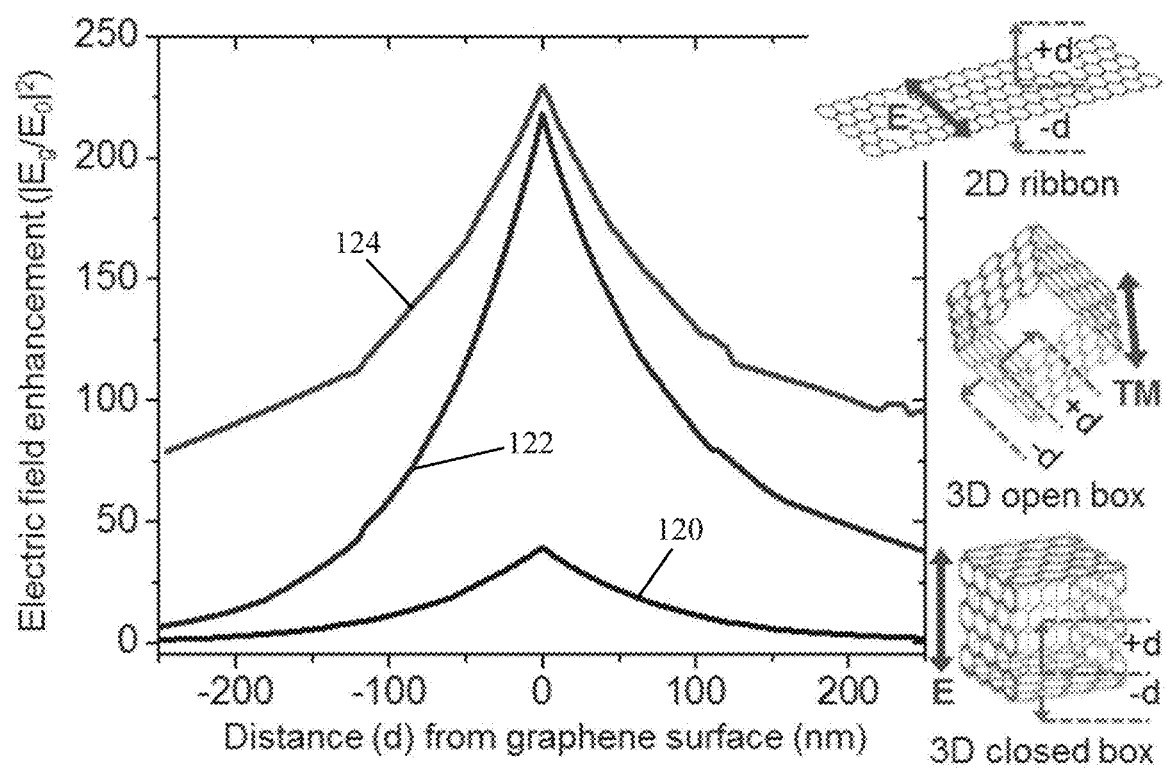
FIG. 8 is a plot of electric field enhancement as a function of distance for differently shaped graphene structures.

For example, FIG. 8 illustrates simulated electrical field enhancements provided by a 2D graphene ribbon (plot line 120), 3D open box sensor structure in accordance with principles of the present disclosure (plot line 122), and a 3D cube or closed box sensor structure in accordance with principles of the present disclosure (plot line 124). In particular, variations in the simulated electric field enhancement (where, $E_g$ is the electric field in the presence of graphene and $E_0$ is the incident electric field) as a function of distance (d) are shown, along with an imaginary line drawn perpendicular to the graphene surface. In 2D ribbon case (plot line 120), the line passes through the geometrical center of graphene ribbon. The distances are measured below (−250 nm) and above (+250 nm) the graphene surface. For the 3D open (plot line 122) box, the line is perpendicular to the direction of polarization of incident electric field and passes through the center of the graphene faces on the bottom of the box. For the 3D closed (plot line 124) box, the line is parallel to the direction of polarization of incident electric field and passes through the hotspot created by the plasmon hybridization. The distances are measured from outside the box (−250 nm) to the center of the box cavity (+250 nm). The illustrations depict the orientation of the line with respect to the field. The uniformly coupled plasmons in the 3D structure reduce the electric field decay with distance as compared to 2D graphene (ribbon), leading to the strong electric field that exists inside the 3D open box (from 0 to +250 nm) and inside/outside of the 3D closed box (from 0 to +/−250 nm).

The sensing area of 2D planar graphene is limited to the region close to the graphene face because the electric field is localized only on the surface and rapidly decays as one moves away from the 2D graphene face. However, the 3D open box structure induces a non-trivial spatial distribution of strong electric fields, resulting from the 3D plasmon hybridization in graphene. The electric field enhancement at the surface of 3D graphene is approximately 4 times higher than that of the 2D ribbon as well as the minimum field enhancement at d=+250 nm in the middle of inside 3D open box is close to the maximum enhancement obtained from a 2D ribbon surface (d=0 nm). This result shows the sensing area can be further extended into the void within the open box, creating a high sensitivity optical sensor. For instance, a graphene 3D, (blood-) vessel-like tube sensor with a strong electric field at the inner/outer surfaces and within the void (or cavity) can be used to sense, with sensitivity higher than that of 2D planar sensors, a substance in the fluid as it flows through the inside of the 3D open box by monitoring for any change in this field. The circular interference patterns at the faces of 3D closed box graphene cubes demonstrate the importance of the cubic structures for the development of plasmonic devices that allows for efficient manipulation of the electric field and for the creation of focused hotspots, which may also lead to high sensitivity.

Unlike the 3D open box, the 3D closed box graphene generates a highly confined electric field within as well as outside of the cubes due to coupling in all directions. When looking at the electric field enhancement inside and outside the cube, the uniform plasmon coupling from all directions creates strong electric field enhancement (approximately 230) at the surface of the graphene (plot line 124 at d=0). The uniform coupling reduces the decay of the field enhancement with a minimum value of approximately 100 (inside cube at d=+250 nm) and 80 (outside cube at d=−250 nm) at a distance of 250 nm from the surface; which is more than two orders of magnitude higher than that of the 2D ribbon (approximately 1 at d=±250 nm). This result implies that by utilizing the highly confined electric field, the 3D closed box graphene can be used as a sensor with high sensitivity to detect and/or secure the targeted substances while maintaining their integrity due to the impermeability of the graphene membranes.

As evidenced by the above, the 3D graphene optical sensors of the present disclosure possess unique physical properties owing to the geometric effect. To further illustrate the influence of geometric shape (i.e., 3D graphene optical sensors of the present disclosure vs. 2D graphene nanoribbon) on graphene's optical properties, the transmission spectra of the 2D and 3D graphene structures were simulated using COMSOL (RF module, ver 5.2). In all simulations, the dimension, L, of 500 nm of 3D graphene was used. For modeling analysis, the graphene conductivity was calculated using the Kubo formula, assuming the graphene relaxation time is 0.35 ps and the graphene doping is 0.4 eV. From these simulations, pronounced dips in the transmission spectra were clearly seen which correspond to the geometrical resonances of the surface plasmons in the graphene. It is well known that the frequency of the geometrical resonances in graphene ribbons scales as $L^{-1/2}$. This explains the shift of the plasmon resonance in the case of transverse electric (TE) excitation of the ribbon compared to the transverse magnetic (TM) case.

By folding a graphene ribbon into a 3D open box, plasmons are effectively limited to the faces of the box. The geometric plasmon resonances at each of the faces in 3D are similar to that of the 2D graphene square. However, the coupling between plasmons (plasmon hybridization) at each of the faces in the 3D open box leads to the splitting of the geometric resonances, which reveals itself as a shift of the resonances in the transmission spectra. In the continuous ribbon case before self-assembly, plasmon resonances are on the whole length of the ribbon (i.e., 3L for horizontal or 4L for vertical), depending on the wave polarization. The response of the continuous closed 3D box (six faces) is similar to that of the 3D open box (four faces) except for the plasmon in all six faces coupled to each other (for open box, only 4 faces are coupled). When the discontinuous ribbon is formed with graphene squares separated by 50 nm (0.1L) gaps, the plasmon resonance modes change due to the non-uniform hybridization that exists between the individual squares along the 3L and 4L directions. The non-uniform hybridization leads to multiple closely spaced resonances with small dips in both TE and TM excitations. It should also be noted that the assembled graphene cube generates only a single resonance in transmission spectra since the geometrical symmetry of the cube causes the uniform plasmon hybridization at each face.

The electric field distributions at the frequency of fundamental resonance in the 2D and 3D structures described above provide further insight into plasmon hybridizations. Electric field distribution for a 2D graphene ribbon of length 4L is that of conventional plasmon dipolar resonances with fields concentrated at the edges of the ribbon. Simulated electric field distribution for a 2D patterned graphene ribbon into a non-symmetric, cross-like pattern (conducive to folding as described above; three square panels in a width direction and four square panels in a length direction as in FIG. 2A) continues to demonstrate an electric field similar to that of the 2D graphene ribbon (FIGS. 5A and 5B). However, under TE excitation, the fundamental resonance frequency and the field at resonance correspond to the resonance of the ribbon of length 4L (length direction), while the two squares in the 3L or width direction do not demonstrate a high field due to their resonance frequency being higher; the reverse phenomenon takes place for the TM excitation. The electric field distributions support the theory of multiple resonances in the transmission spectrum as surmised by the inventors of the present disclosure. The nonuniform coupling within adjoining graphene strips enhances the electric field within the gaps of the graphene. This enhancement of the field within a given gap is highly dependent on the number of graphene surfaces surrounding it and the polarization direction of the electric field.

Simulated electric field distribution for a 3D graphene open box with four faces under TM excitation differs from that of the 2D graphene ribbons to a great extent. Instead of the electric field rapidly decaying away from the 2D graphene surface, the electric field in the 3D open box extends into the void between the graphene faces. The 3D distribution shows the uniform reduction in the field as it moves from the edges to the center of a face without any graphene, creating circular electric field spots due to the symmetry of the structure.

The simulated distribution of the plasmon electric field in the case of a 3D graphene six-faced cube (3D closed box) provides further insight in the hybridization of the plasmons in 3D structures. To explore the effect of the packing density, the 3D closed box was studied with three different gap sizes between the faces: no gap, 50 nm gap, and 150 nm gap. In all three constructions, circular interference patterns are clearly seen on the cube faces which are orthogonal to the polarization of the electric field. As the faces of 3D cubes are orthogonal to the electric field polarization, the surface plasmons cannot be excited directly by the incident wave. Rather, they are generated by the fields of the surface plasmons excited on the neighboring faces. The uniform constructive and destructive interferences of the plasmon produce the above-mentioned circular interference patterns or "hot spots". The electric field intensity and the diameter of the maxima at the center of the face increase as the gap decreases due to increased interaction between plasmons generated at the neighboring faces. For a continuous graphene cube, the diameter is slightly bigger than the size of the face of the cube which leads to the interference maxima occupying nearly the entire face. The unique optical properties of 3D closed and open box structures evidence fabrication of ultra-sensitive, compact molecular sensors of the present disclosure. As described above, exposing a graphene sensor to a foreign substance(s) (e.g., particles and molecules) changes the optical response (resonance frequency in the transmission spectrum) of the sensor depending upon the characteristics of the target substances. A problem with 2D graphene sensors is the multiple, closely spaced resonances seen in the transmission spectra of the 2D graphene arrays could mask the frequency shift induced by the target substances. However, using the 3D graphene optical sensors of the present disclosure (e.g., with a single resonance in transmission spectrum) allows the detection of the foreign substances without complications arising from closely spaced resonances.

C1. Nano-Architecture Driven Plasmonic Field Enhancement: Polyhedral

As a point of reference, plasmonic field enhancement is directly proportional to the intensity of the photons that will be absorbed by the targeted molecules for sensing applications and can thus be a parameter of interest in determining the viability of graphene for ultrasensitive molecular sensors. For example, for a 2D graphene ribbon with a of width 500 nm and length 2000 nm, it can be determined that the field enhancement exponentially drops to approximately 0 (i.e., drops by 1/e) at a distance of 40 nm of the edge (z direction) of the ribbon and at a distance of 220 nm on the surface (y direction) of the graphene away from the edge. At low concentrations of analyte (less than 100 ppM), the detection is primarily limited by diffusion of the molecules to the surface of the graphene nanoribbon containing the intensified E-field to the exponential e decay by 64% even 40 nm away from the surface. This constraint has limited the sensitivity of plasmon-based molecular sensors to $10^{-12}$ mol/cm$^2$; the sensitivity of these sensors reduces further as the size is reduced. The analysis of single protein or molecules with a radius of 2 nm require a minimum detection limit in feto and atto moles which is not attainable by the 2D planar sensors.

In some embodiments, the nano-architecture of the 3D graphene sensors of the present disclosure can be selected to drive the plasmonic field enhancement. For example, in conjunction with the self-assembly techniques described above in which melting of a polymer hinge is utilized to generate a surface tension force that folds the 2D patterns into 3D structures, the architecture and dimensions of the resulting 3D graphene can be controlled by modifying the 2D graphene patterns that need to be self-folded. The coupling of adjoining faces and edges in the resultant 3D graphene structures produces distinct plasmon hybridization modes. The effect of the architecture on these coupled plasmon modes can be selected to address the effect of shape and plasmon wavelength, as well as the dependence on the ratio of dimensions comprising the 3D structure.

When the 2D graphene pattern is self-assembled into a 5-faced square graphene pyramid, the coupling of the plasmonic resonances on adjoining graphene surfaces can lead to distinct hybridized modes. Primarily, two such modes can occur. Firstly, when the incident E filed is polarized towards the apex of the pyramid (TM mode), and secondly when the incident E field is polarized across the base of the pyramid (TE mode). Simulation for plasmon resonance modes was carried out using Comsol RF module, with the conductivity of graphene as given by the Kubo formula. For a square pyramid with equal length (L) and width (W), the two modes exist close to each other in frequency (17.0 THz for TE mode and 18.2 THz for TM mode at L=W=500 nm) due to the same length of graphene in the direction of polarization. Under TM excitation, a strong field exists at the apex of the pyramid as a result of the reduced width at the pyramid. The strong field at the apex decays as the distance from the apex increases; however, at the base of the pyramid, a strong field reappears due to the uniform plasmon interference from the edges of four adjoining faces of graphene. Under TE excitation, a reverse phenomenon takes place where a strong field is seen only near the base of the pyramid and decaying towards the apex as a result of the greater edge-based field interference.

For the graphene square pyramid, while maintaining equal length and width, the size of the pyramid can be increased. The change in the size of the pyramid causes a proportional change in resonant frequency. The near-field enhancement ($I_g$) within the pyramids of varied sizes increases as the size of the pyramid is reduced. For example, from simulations of a 500 nm pyramid, a very strong enhancement ($4.4\times10^4$) exists at the apex and reduces towards the base of the pyramid by two orders of magnitude (where $I_g$ was determined as the square of the ratio of electric field due to graphene ($E_g$) to the incident electric filed ($E_o$); $I_g=(E_g/E_o)^2$). As the size of the structure is reduced to 250 nm and 100 nm, the near field created at the apex cannot reduce by two orders of magnitude across the structure due to the shorter length of the pyramid. Thus, for a 50 nm pyramid structure, a strong near-field enhancement can be obtained that encompasses the pyramid.

The maximum near-field enhancement that can be obtained for any size of the pyramid is scaled exponentially with the size of the structure as $e^{1/\lambda}$, where $\lambda$ is the wavelength of resonance at the particular size. Moreover, the smaller decay of the near-field enhancement over the entire structure as well as an increase in the maximum enhancement also creates and exponentially increases the enhancement created within the pyramid giving an overall increasing average enhancement within the volume of the pyramid with decreasing size. A similar behavior can be found with scaling of the size under TE mode excitation. In contrast, for a 2D graphene nanoribbon that is scaled proportionally in length and width of the ribbon, the maximum near-field enhancement increases similar to the 3D pyramid; however, even at 50 mm width of the ribbon, a strong drop in the enhanced electric field can be found across the surface of the ribbon.

The simultaneous scaling of the length (L) and width (W) of the pyramid proportionally changes the wavelength of resonance and consequently the near-field enhancement. However, for a constant width (size in the direction of polarization of the incident E field) the plasmon wavelength remains nearly constant. For example, if the L/W ratio for the pyramid structure is varied such that L/W=0.5, 1, 2, 4, 8, etc. for a constant width of 250 nm, the enhancement obtained and the decay can also be varied. To obtain the varied L/W ratio, the length of the pyramid can be varied such that a smaller change in TM resonant frequency ($f_r$) is obtained. By way of example, for the simultaneous scaling of length and width, a 35 THz change in resonant frequency was obtained for a 450 nm (500 nm to 50 nm) variation in size. However, for a constant width, the change in the length of the pyramid may cause only an approximately 20 THz shift in resonant frequency for a 1875 nm change in length (e.g., L=2000 nm, $f_r$=25.4 THz at L/W=8 and L=125 nm; $f_r$=5.6 THz at L/W=0.5). When the L/W ratio is reduced from 1.0 to 0.5, the narrower slant surfaces of the pyramid structure result in an increased E filed at the slant edges, hence causing the enhancement at the slant edges and the slant surfaces to double. The interference of the field from the slant edges also increases the field created at the apex. On the other hand, if the L/W ratio is increased by increasing the length of the base, the increased dimensions of the slant and base surfaces, decreases the intensity of the field enhancement across them. At lower L/W ratio for the pyramid, the strong field at the apex of the pyramid and the uniform interference from the slant surfaces creates an area of increased near-field enhancement across the base of the pyramid that remains constant over the entire area of the base. However, at larger L/W ratios, the interference from the edges and the field scattered from the apex of the pyramid is unable to reduce the decay of the near-field across the entire area of the base. Thus, reverting to lower plasmonic field enhancements that occur in 2D graphene ribbons. The largest enhancement of the base of the structure occurs for L=W because the resonant frequency for the base of the pyramid matches that of the apex.

The electric field enhancement can differ with other shapes. For example, and as described above, the 2D graphene patterns can be self-assembled into 3D cube-based structures (e.g., as in FIG. 2C). The 3D plasmon hybridization in the cubic structures leads to large hotspot surfaces of enhanced electric field on the surface perpendicular to the direction of polarization of the incident electric field. Unlike the near-field enhancements in the 3D graphene pyramid where the maximum value is concentrated to a point at the apex of the pyramid, for the 3D cube, the maximum enhancement spreads over the entire hotspot surface of the cube. The large uniform hotspot surfaces and confinement from all directions leads to an enhanced volumetric field within the volume of the cube. Furthermore, in contrast to the apex of the pyramid where the tapered graphene surfaces result in a point of extreme enhancement, the corners of the 3D cube with uniform surfaces in all directions do not demonstrate a high field enhancement. As the size of the cube is scaled, the near-field enhancement that is obtained on the surfaces of these structures also changes. For example, simulated plasmonic field enhancement for a 3D graphene cube with a changing size of the cube from 500 nm to 100 nm shows the resonant frequency increasing from 15 THz to 33 THz. When the size of the cube is changed from 500 nm to 50 nm, the enhancement on the surfaces of the cube increases such that between 500 nm-250 nm and 250 nm-100 nm, the lowest field obtained at the surface of the smaller cube is equal to the maximum hotspot field of the larger cube ($I_{g,\,min}$ (250 nm)>$I_{g,\,max}$ (500 nm)). Similar to the 3D pyramid, as the size of the cube decreases, the plasmon wavelength also decreases (e.g., resonant frequency increases from 15 THz to 46 THz between 500 nm to 50 nm cube length). This change in wavelength causes an exponential increase in the enhancement obtained across all the surfaces.

The increase in plasmon wavelength and the intensity in the hotspot surface with cube structures described above also results in a proportional increase in the volumetric field induced within the volume of the cube, causing an increase in the enhancement. For example, simulations reveal that the proportional increase in the volumetric field causes an increase in the enhancement by an order of magnitude between the maximum $I_g$ for 500 nm and the minimum $I_g$ for 50 nm size of the 3D cube.

For a cube with equal length in all directions, a uniform circular hotspot is created on the surfaces that are perpendicular to the direction of the incident E field. The circular shape of the hotspot is caused by the symmetry and equal length (L/W=1) of the structure in all directions. As the L/W ratio for the 3D cubic structure is changed, the enhancement across the surface of the hotspot demonstrates a behavior opposite to that in the 3D pyramid. For example, simulations performed by the inventors of the present disclosure show enlargement in area and increase in intensity (log scale) of the hotspot surface created by the plasmon hybridization in 3D cubes due to the increase in L/W ratio from 0.5 to 8.0 for a constant panel width W=250 nm and increasing or varying panel lengths of L=125 nm, 500 nm, 1000 nm, and 2000 nm. At lower L/W ratios (L/W<1), the length of the hotspot surface is insufficient to produce the maximum enhancement at the center of the graphene surface (e.g., where panel length L=125 nm). When the L/W ratio is increased (L/W=2 or 4), the uniform interferences from the edges of the adjoining surfaces leads to an enhanced hotspot surface. At L/W=2 (L=500), the maxima created at the center of the surface encompasses the entire graphene face with intensity $I_g$ of approximately $10^6$; the shape of the hotspot maxima changes to an elongated circle due to the dissimilar length and width of the cubic structure. The maximum radius for the hotspot surface was found to be approximately 1400 nm, resulting in a small decay seen from L/W=8. The maximum radius of the hotspot results in an increase of the volumetric field enhancement at the center of the cubic structure from 200 to 800 between L/W ratios of 0.5 and 4, and an almost constant field enhancement with minimal variation between L/W ratio of 4 and 8 due to the saturation of the hotspot radius.

C2. Nano-Architecture Driven Plasmonic Field Enhancement: Tubular

The 3D graphene sensors of the present disclosure can assume a wide variety of other shapes that can be selected to provide desired field enhancement. For example, the 3D graphene sensor can be a hollow cylindrical 3D graphene tube that undergoes unique plasmon hybridization modes and field interference even in the absence of adjoining edge and face coupled surfaces that otherwise exist in polyhedral structures (e.g., pyramids and cubes). In some embodiments, and as described in greater detail above, the hollow cylindrical 3D graphene tube or cylindrical structures of the present disclosure can be formed via self-assembly of a 2D graphene ribbon or net. The resulting rolled-up graphene tube fabricated from a ribbon of width W has a diameter D=W/π. The small diameter circular opening at both ends of the tube retain the strong edge enhancement of the 2D ribbon, thereby causing a large field enhancement engulfing the circular perimeter at the opening. The strong field created at the openings of the tube decays along the length inside the tube away from the openings (similar to the 2D ribbon). By way of example, simulations reveal that when the width W (where W=πD) and the length L are simultaneously varied such that L=4W and W=500 nm, 250 nm, 100 nm, and 50 nm, the maximum near-field enhancement obtained scales exponentially similar to the 3D graphene pyramid and cube described above due to an increase in plasmon resonant frequency. The strong field is concentrated only along the perimeter at each of the openings of the tube at larger widths W of 500 nm and 250 nm. However, at lower widths (e.g., W=100 nm and 50 nm), the uniform cross interference of the field at every point on the circular opening with the field from another point on the edge lying radially opposite creates a virtual surface of strong near-field enhancement that remains uniform across the entire cross-section of the tube opening. The maximum near-field created at the opening of the tube decays rapidly towards the middle of the tube, for example covering only 8% of the entire length of a tube with width W=500 nm. On the other hand, a smaller decay is experienced for the 50 nm tube due to the strong uniform enhancement allowing a coverage of 16% over the length of the tube. The decay of the field within the length of the tube provides it with a lower volumetric enhancement as compared to the 3D cube and pyramid; however, the increased interference and coverage at the lower dimensions of the tube leads to an exponential increase in the volumetric enhancement induced within the tube.

Simulations of the 3D graphene tube examples described above demonstrated the decay to zero towards the middle of the tube for L/W ratio of 2, 4, and 8, and the non-zero field at the center for L/W of 0.5 and 1.0. For a tube of width 250 nm, at an L/W ratio of 4.0 (i.e., length of the tube is 1000 nm), the strong near-field enhancement is limited to the perimeter of the circular edge openings and covers 11.6% of the length of the entire tube. At high L/W ratios (e.g., 2-8), the open ends of the tube are likely too far apart to result in an interference at the center of the tube. This results in a strong decay of the enhanced near-field towards the middle of the tube, decaying from approximately 5000 at the opening of the tube down to 0 at the normalized positions of 0.8, 0.6, and 0.4 within the tube at the varying L/W ratios. However, at lower L/W ratios of 1.0 and 0.5, the smaller distance between the opposing open ends of the tube results in a field interference at the center of the tube, in turn resulting in a field at the center of the tube that is only reduced by a factor of 4 when compared to the field at the open ends for a tube with L/W=1.0. Where the L/W ratio is further reduced to 0.5, the strong interference at the center of the tube due to the smaller length (L=125 nm) creates a nearly uniform enhancement across the entire length of the 3D cylindrical tube. As a point of reference, the unequal enhancements obtained at the opposing, two end openings of the tube may be primarily caused by the insufficient mesh dimensions that cannot be decreased with current computational capabilities.

With the self-assembled graphene micro- or nanotubes (or cylinders) of the present disclosure, the addition of an extra spatial degree of freedom to the 2D plasmonic ribbons can drastically change the localized surface plasmon resonances (LSPRs) in these structures, and can consequently affect the associated near-field enhancement. The field enhancement at the resonance frequency directly controls the sensing capabilities of plasmonic sensors.

Figure 10A:
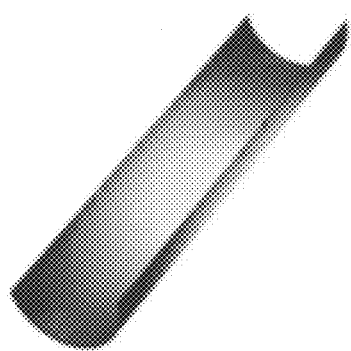
FIG. 10A is a simulated electric field enhancement for a 3D graphene half-way curved nanocylinder at the frequency of geometric resonance plotted on the half-way curved nanocylinder.
Figure 10B:
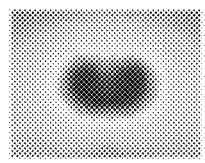
FIG. 10B is a cross-sectional image showing the field enhancement of FIG. 10A.
Figure 11A:
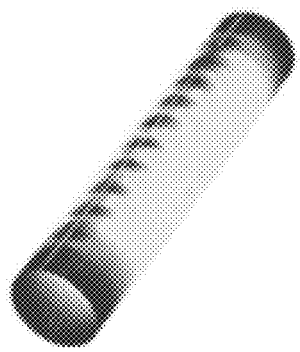
FIG. 11A is a simulated electric field enhancement for a 3D graphene nearly completely curved nanocylinder at the frequency of geometric resonance plotted on the nearly completely curved nanocylinder.
Figure 11B:
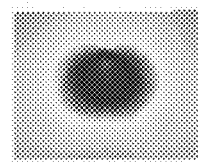
FIG. 11B is a cross-sectional image showing the field enhancement of FIG. 11A.
Figure 12A:
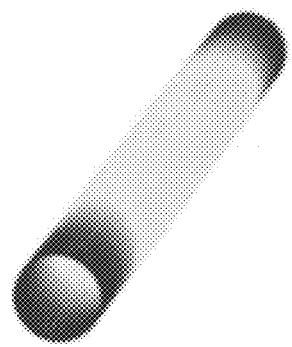
FIG. 12A is a simulated electric field enhancement for a 3D graphene completely curved nanocylinder at the frequency of geometric resonance plotted on the completely curved nanocylinder.
Figure 12B:
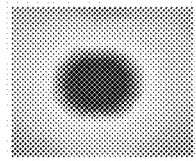
FIG. 12B is a cross-sectional image showing the field enhancement of FIG. 12A.
Figure 13:
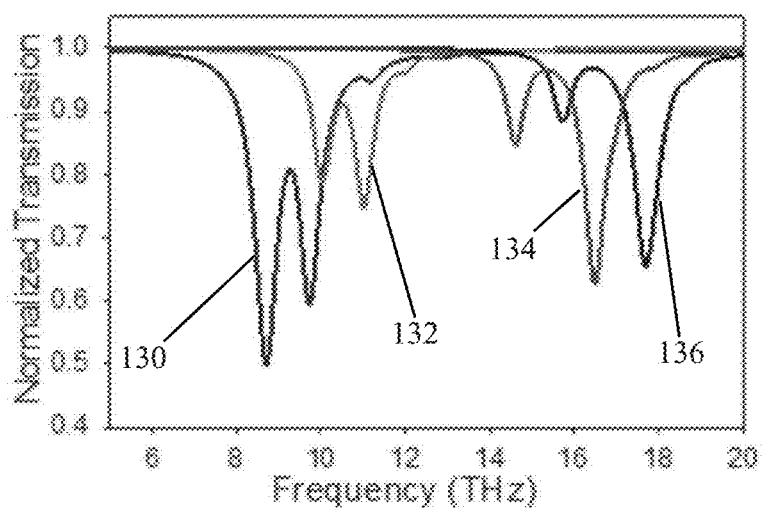
FIG. 13 is a plot of normalized transmission response for the simulated 2D graphene nanoribbon of FIG. 9A and the simulated 3D graphene nanocylinders of FIGS. 10A, 11A, and 12A.

For example, simulations utilizing COMSOL Multiphysics version 5.2a to model the electromagnetic response of 2D graphene ribbons (rectangular) and 3D graphene nanocylinder surfaces as described below in a vacuum with a frequency dependent surface current density computed from the conductivity of graphene as given by the Kubo Formula with a fermi level of 0.4 eV. The graphene ribbon of width 1.5 µm and length 6.0 µm and the same ribbon dimensions were transformed into 3D halfway and completely curved nanocylinder geometries. The LSPR frequencies were determined from the transmission spectra of the graphene structures, and the corresponding electric field enhancement was plotted. Strong field enhancement at the edges of the 2D ribbon were found to be significantly modified in the case of curved 3D structures due to the increased field coupling between opposite edges of the curved 3D structures. From these simulations, field enhancement plotted on the surface and cross-sectional plane at successive stages of the self-assembly process were generated. The 2D ribbon is reflected by FIGS. 9A (surface) and 9B (cross-sectional plane); 3D half-way curved cylinder is reflected by FIGS. 10A (surface) and 10B (cross-sectional plane); 3D nearly complete cylinder with 1% gap between opposing edges is reflected by FIGS. 11A (surface) and 11B (cross-sectional plane); and completely curved cylinder is reflected by FIGS. 12A (surface) and 12B (cross-sectional plane). As a point of reference, the field enhancement scale provided with FIG. 9A also applies to FIGS. 9B-12B. FIG. 13 is a plot of the normalized transmission through the structures (2D ribbon is plot line 130; half-way curved cylinder is plot line 132; nearly complete cylinder with 1% gap between opposing edges is plot line 134; completely curved cylinder is plot line 136). When the 2D graphene ribbon is self-curved, the plasmon resonant frequency shifts to a higher frequency proportional to the change in length in the direction of polarization of the incident electric (E) field.

The effect of plasmon hybridization in 3D graphene nanocylinders is further accentuated when substrate effects are taken into account. For example, the simulations described in the previous paragraph were carried out in vacuum with a refractive index=1. Further simulations were performed at the same stages of the graphene 2D ribbon-to-cylinder self-assembly process on a silicon substrate with a width of 3 µm, a thickness of 1.5 µm, a length of 4.5 µm, and a refractive index of 3.48. From these simulations, field enhancement plotted on the surface at successive stages of the self-assembly process were generated. The 2D ribbon is reflected by FIG. 14A; half-way curved cylinder is reflected by FIG. 14B; nearly complete cylinder with 1% gap between opposing edges is reflected by FIG. 14C; and completely curved cylinder is reflected by FIG. 14D.

Figure 9A:
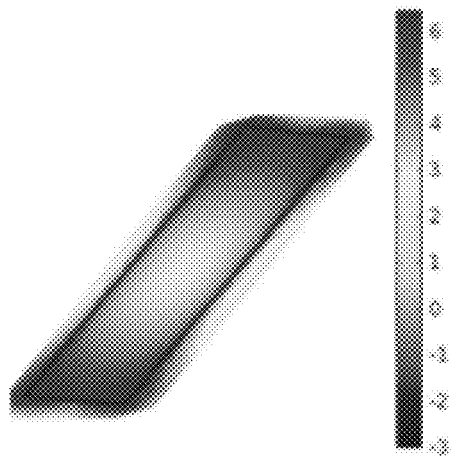
FIG. 9A is a simulated electric field enhancement intensity for a 2D graphene nanoribbon at the frequency of geometric resonance plotted on the nanoribbon.
Figure 9B:
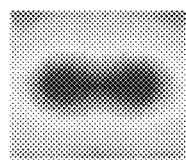
FIG. 9B is a cross-sectional image showing the field enhancement of FIG. 9A.
Figure 15:
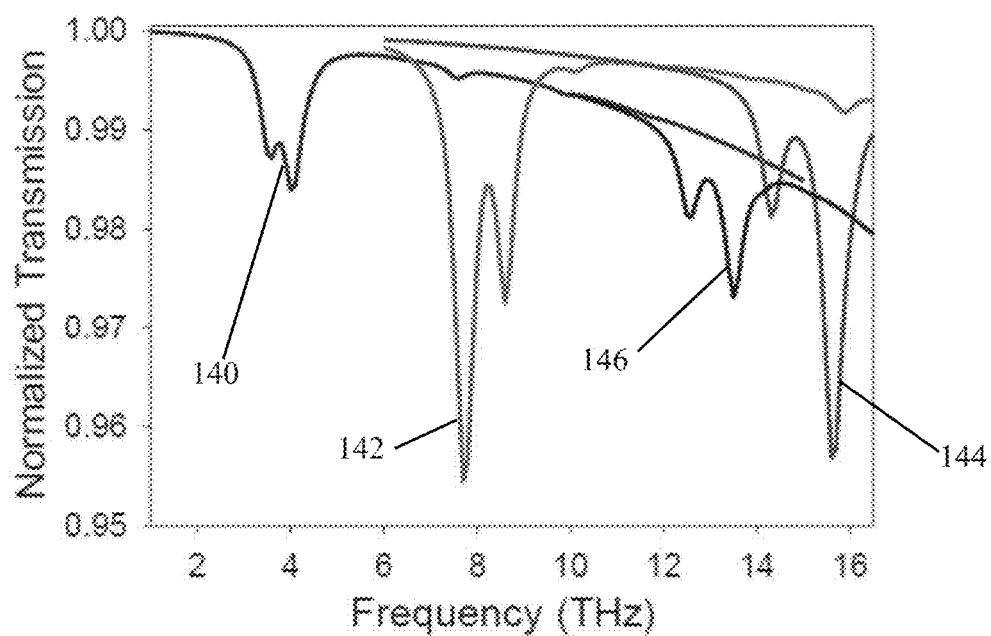
FIG. 15 is a plot of the normalized transmission response for the simulated 2D graphene nanoribbon on silicon substrate of FIG. 14A and the simulated 3D graphene nanocylinders on silicon substrate of FIGS. 14B-14D and showing the resonant frequency for each of the structures.
Figure 16:
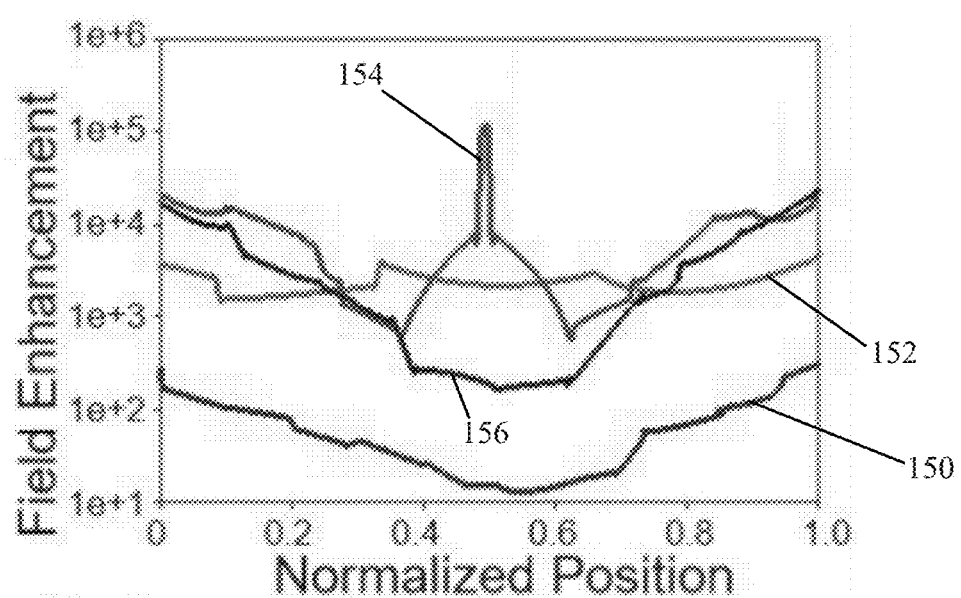
FIG. 16 is a plot of field enhancement for each of the simulations of FIGS. 14A-14D taken in a plane at an edge of each of the structures.

FIG. 15 is a plot of the normalized transmission through the structures from the simulations (2D graphene ribbon on silicon substrate is plot line 140; half-way curved cylinder on silicon substrate is plot line 142; nearly complete cylinder with 1% gap between opposing edges on silicon substrate is plot line 144; completely curved cylinder on silicon substrate is plot line 146). FIG. 16 is a plot of the field enhancement in ZX plane along the circumference or width at the ends of the structure (2D graphene ribbon on silicon substrate is plot line 150; half-way curved cylinder on silicon substrate is plot line 152; nearly complete cylinder with 1% gap between opposing edges on silicon substrate is plot line 154; completely curved cylinder on silicon substrate is plot line 156). A strong degradation and localization of the plasmon near field enhancement occurs due to the presence of the substrate, limiting the enhanced field to the corners of the ribbon only as compared to the 2D graphene ribbon in vacuum where a uniformly decaying field is found across the surface of the ribbon (FIG. 9A). When the 2D graphene ribbon is curved relative to the substrate to form a tubular structure and the degree of curvature is increased, the spatial overlap of the graphene with the underlying substrate decreases, leading to a corresponding decrease in the influence the underlying substrate has on the electric field enhancement. A partially or completely curved graphene micro- or nanostructure (e.g., 14B-14D) retains a stronger near filed enhancement spreading over a larger area, similar to the freestanding partially or completely graphene structures described in the previous paragraph.

By way of comparison, simulations revealed that the field enhancement at the edges of the 2D graphene ribbon on silicon substrate is two orders of magnitude lower than the enhancement for the freestanding 2D graphene ribbon (in vacuum), and decays by an order of magnitude when moving away from the edges of the ribbon to its center (plot line 150 in FIG. 16). On the other hand, simulations of the halfway curved graphene nanocylinder on silicon substrate (FIG. 14B), a line-type substrate contact leads to minimal spatial overlap, as opposed to 100% surface area contact between the 2D graphene ribbon and underlying substrate. The lower overlap with the substrate, stronger field coupling between the points on the circumference of the graphene cylinder structure as well as radial field coupling across the nanoscale (or microscale) openings of the graphene cylinder leads to an enhancement that is two orders of magnitude stronger than in the 2D graphene ribbon and remains constant across the width of the partially curved nanocylinder (plot line 152 in FIG. 16). Similarly, the completely curved graphene nanocylinder on silicon substrate (FIG. 14D) undergoes an even stronger enhancement, which is nearly two orders of magnitude stronger than for the freestanding, completely curved graphene nanocylinder (in vacuum), through additional localized enhancement occurring between the curved graphene and the substrate alongside twice as much radial coupling along the circumference at the opening (ends) of the nanocylinder. The simultaneous localization and radial coupling give rise to a virtual cross-sectional area of strong field enhancement at the opening of the completely curved graphene nanocylinder. The non-limiting example simulations showed that the 3D plasmon couplings at the openings of the completely curved graphene nanocylinders induced a total integrated edge enhancement of 1149, which is 13 times higher than the total field enhancement of 87 at the edge of the 2D graphene ribbon. Moreover, the field enhancement induced in the 3D graphene nanocylinder can be further modified by via controlling the gap in the nanocylinder.

Figure 17A:
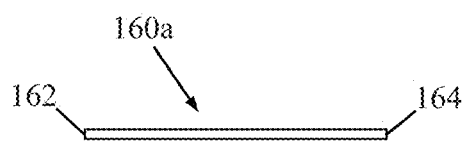
FIG. 17A is a simplified end view of a 2D graphene nanoribbon.
Figure 17B:
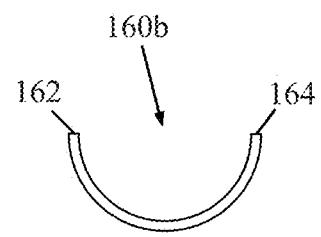
FIG. 17B is a simplified end view showing self-transitioning of the 2D graphene nanoribbon of FIG. 17A to a 3D graphene half-way curved nanocylinder.
Figure 17C:
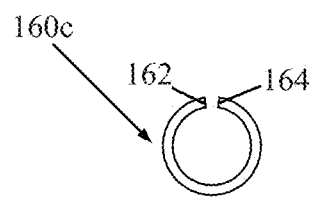
FIG. 17C is a simplified end view showing self-transitioning of the 2D graphene nanoribbon of FIG. 17A to a 3D graphene nearly completely curved nanocylinder.
Figure 17D:
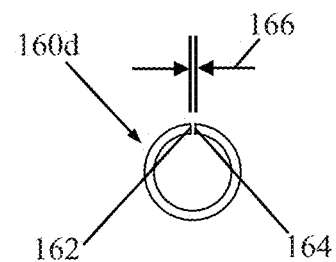
FIG. 17D is a simplified end view showing self-transitioning of the 2D graphene nanoribbon of FIG. 17A to a 3D graphene completely curved nanocylinder.

With some of the 3D graphene nanocylinders (or microcylinders) of the present disclosure, such as, for example, some 3D graphene nanocylinders formed by the self-assembly process described above, even with what otherwise appears to be a "completely curved" structure, a small gap may exist between the two edges joining together that introduces the possibility of edge effects along the length of the structure. As a point of reference, FIG. 17A is a simplified end view of a 2D graphene nanoribbon 160a prior to the self-assembly process. Opposing edges 162, 164 of the graphene nanoribbon 160a are identified in the view. With self-assembly, the 2D graphene nanoribbon 160a transitions to a partially curved 3D graphene nanocylinder 160b as in FIG. 17B. As shown, curving of the 2D graphene nanoribbon 160a to the partially curved 3D graphene nanocylinder 160b brings the opposing edges 162, 164 towards one another. Where desired, with further self-assembly or self-curving, the partially curved 3D graphene nanocylinder 160b transitions to a nearly complete 3D graphene nanocylinder 160c as in FIG. 17C. The opposing edges 162, 164 are now even closer together. Where desired, with further self-assembly or self-curving, the nearly complete 3D graphene nanocylinder 160c transitions to a complete 3D graphene nanocylinder 160d as in FIG. 17D. The edges 162, 164 may now be in flush contact with one another. In other embodiments, a slight (e.g., nano) gap 166 may exist between the edges 162, 164 of the complete 3D graphene nanocylinder 160d. By way of non-limiting example, even for a completely curved, self-assembled graphene nanocylinder, the gap 166 may be on the order of less than 10 nm.

Figure 14:
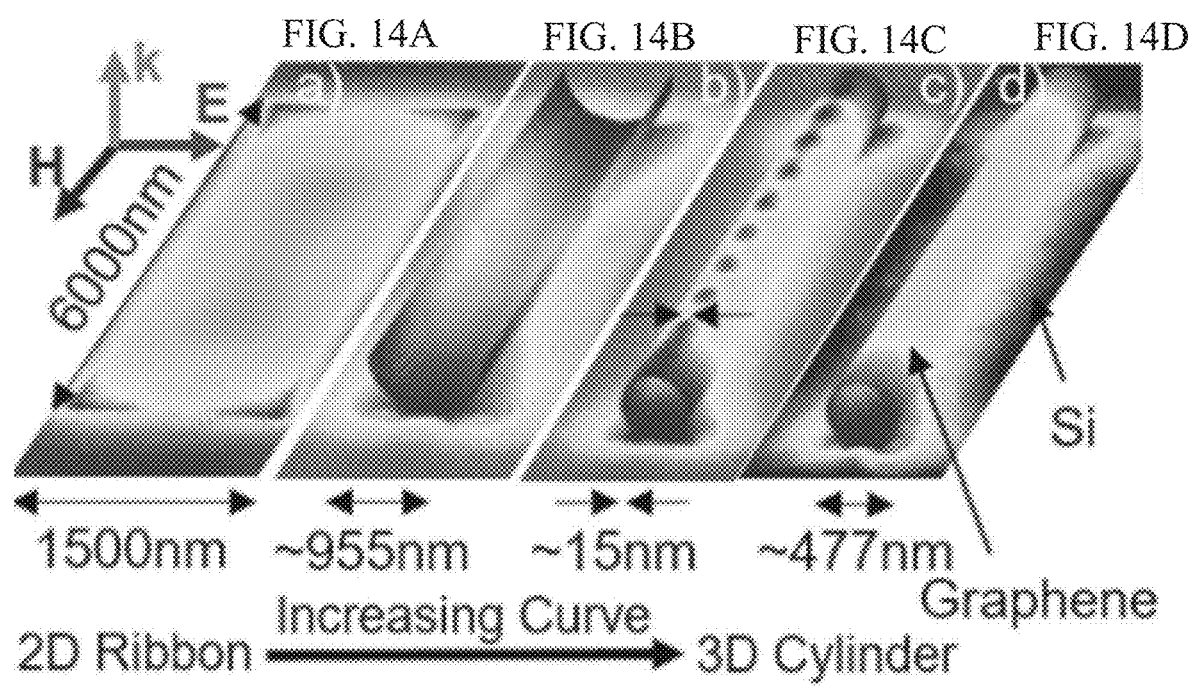
FIG. 14A is a simulated electric field enhancement for a 2D graphene nanoribbon on a silicon substrate at the frequency of geometric resonance plotted on the 2D nanoribbon.
FIG. 14B is a simulated electric field enhancement for a 3D graphene half-way curved nanocylinder on a silicon substrate at the frequency of geometric resonance plotted on the half-way curved nanocylinder.
FIG. 14C is a simulated electric field enhancement for a 3D graphene nearly completely curved nanocylinder on a silicon substrate at the frequency of geometric resonance plotted on the nearly completely curved nanocylinder.
FIG. 14D is a simulated electric field enhancement for a 3D graphene completely curved nanocylinder on a silicon substrate at the frequency of geometric resonance plotted on the completely curved nanocylinder.
Figure 18:
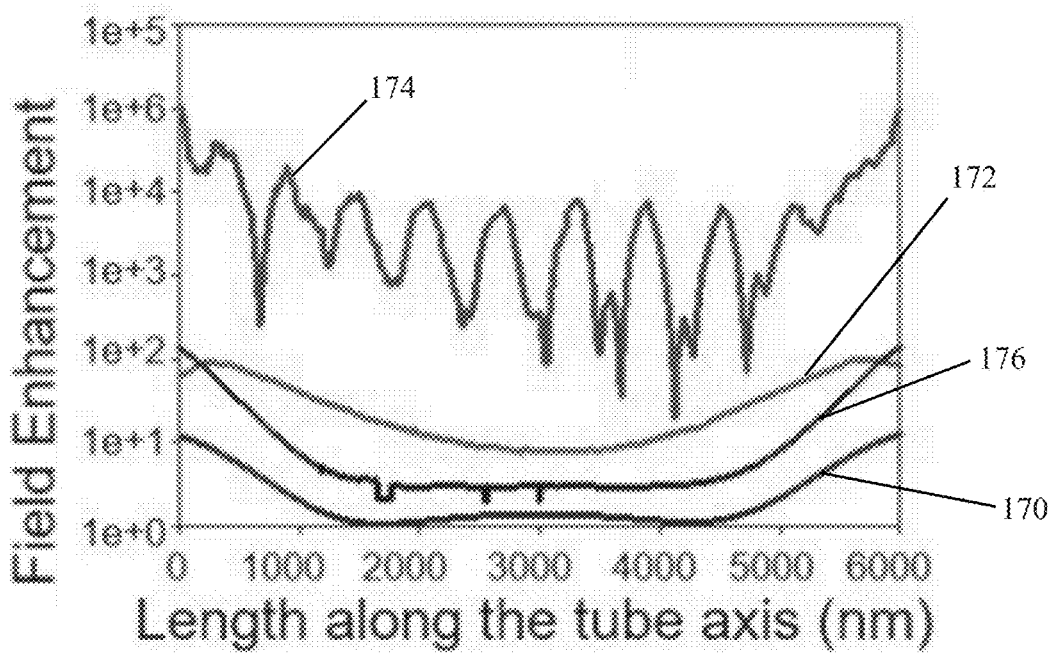
FIG. 18 is a plot of electric field enhancement at the surface of the nanoribbon of the simulation of FIG. 14A, at the center of the gap of the 3D nanocylinders of the simulations of FIGS. 14B and 14C, and at the surface of the nanocylinder of the simulation FIG. 14D.

With the above explanations in mind, some embodiments of the present disclosure provide 3D graphene micro- or nanocylinder structures with a nanogap (e.g., the gap 166). The nearly complete cylinder with 1% gap between opposing edges of FIG. 14C is one example. From the simulations with a 15 nm gap between the edges as shown in FIG. 16 (at plot line 154), the gap further enhances the coupled field at the center of the gap by an order of magnitude as compared to other structures. The simulations exhibit that the field enhancement inside the 15 nm gap is 300 times stronger than the maximum enhancement obtained at the edges of the 2D graphene ribbon (plot line 150 in FIG. 16). FIG. 18 is a plot of the field enhancement from the simulations described above along the length of the structure (2D graphene ribbon on silicon substrate taken along the surface of the ribbon is plot line 170; half-way curved cylinder on silicon substrate taken along the center of the gap between the opposing edges is plot line 172; nearly complete cylinder with 1% gap between opposing edges on silicon substrate taken along the center of the gap is plot line 174; completely curved cylinder on silicon substrate an imaginary edge is plot line 176). From FIG. 18, the geometrically confined field in the partially curved graphene nanocylinders exists along the entire length of the nanocylinder. This leads to a field enhancement four orders of magnitude stronger as compared to that at the center of the 2D graphene ribbon (plot line 170). Oscillations in the field strength of the nearly complete cylinder with 1% gap (plot line 174) indicates the highly confined propagating mode existing within the gap. In some embodiments, the strongly confined, high enhancement, propagating edge modes are useful for the development of graphene-based optoelectronic devices of the present disclosure including waveguides to achieve exceptional propagating lengths and figures of merit. The completely curved graphene nanocylinder (plot line 176) does not show propagating modes, thus supporting the conclusion that modes observed in the partially curved graphene nanocylinders are purely edge modes. However, at the center of the complete curved graphene nanocylinders, even in the absence of the edge modes, the 3D coupling enables field enhancement that is an order of magnitude stronger than at the center of the 2D graphene ribbon.

Figure 19:
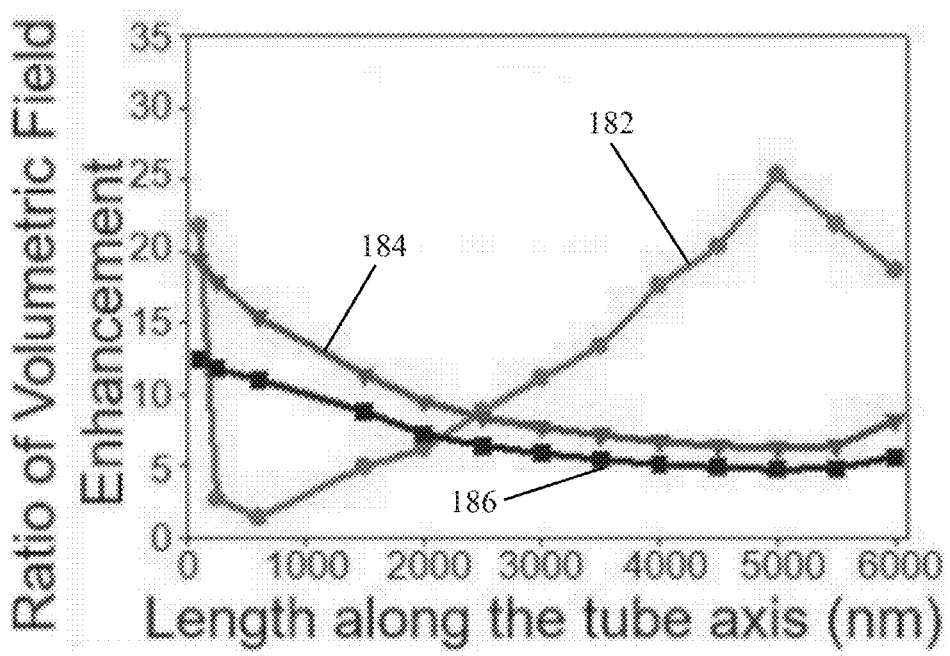
FIG. 19 is a plot of a ratio of volumetric field enhancement of the simulations of FIGS. 14B-14C relative to the volumetric field of the simulation of FIG. 14A.

The strong uniform field enhancement at the openings (ends) of the graphene nanocylinders induced by radial and edge couplings can also be termed as volumetric enhancement, which is computed as in integral of the filed enhancement at the cross-section of the openings. FIG. 19 is a plot of the volumetric field enhancement from the simulations described above along the length of the structure based on their ratio to the volumetric field in a 2D graphene ribbon. Volumetric enhancement was calculated by taking the volume integral of the near field enhancement inside the 3D structure and for an imaginary rectangular box of thickness 119 nm placed on the 3D ribbon with lengths increasing from 119 nm to 6 µm. The volumetric enhancement is computed as the square of the ratio of the volumetric field in the presence of graphene to the incident volumetric field for the same volume. Half-way curved cylinder on silicon substrate is plot line 182; nearly complete cylinder with 1% gap between opposing edges on silicon substrate is plot line 184; completely curved cylinder on silicon substrate is plot line 186). The total volumetric enhancement for the uniform field in a half-way curved graphene nanocylinder (plot line 182) is twenty times higher than the volumetric field in 2D graphene nanoribbons over the full length (6000 nm) of the structures.

The 3D graphene nanocylinders of the present disclosure can provide reduced spatial overlap (as compared to a 2D graphene nanoribbon) with the underlying substrate while simultaneously giving rise to stronger field enhancements, for example due to edge-substrate interactions and radial coupling stemming from the curvature. Some of the 3D graphene nanocylinders of the present disclosure extend the capabilities of graphene-based devices by offering compatibility with insulating and semiconducting substrates while preserving the plasmon resonance of pristine graphene. For high sensitivity detection of biological analytes, the minimum detectable concentration is directly dependent on the changes in the frequency spectrum arising from changes in the electric field due to the dielectric properties of the targeted molecules. Hence, the near-field enhancement by graphene nanostructures can be a parameter in the development of higher sensitivity biological sensors. The virtual cross-sectional area of strong uniform field at the openings of the 3D graphene nanocylinders of some embodiments of the present disclosure can be leveraged for the fabrication of cylindrical vein-like plasmonic optofluidic channels for analysis of molecules flowing within them. Since every molecule traversing through the 3D channel must pass through the virtual cross-sectional area at the opening (ends) of the 3D graphene nanocylinder, the strongly enhanced field interacts with each of the molecules, thereby eliminating the limitations in sensitivity associated with 2D graphene ribbon sensors that otherwise arise from the need for the molecules to diffuse to the graphene ribbon surface.

Figure 20:
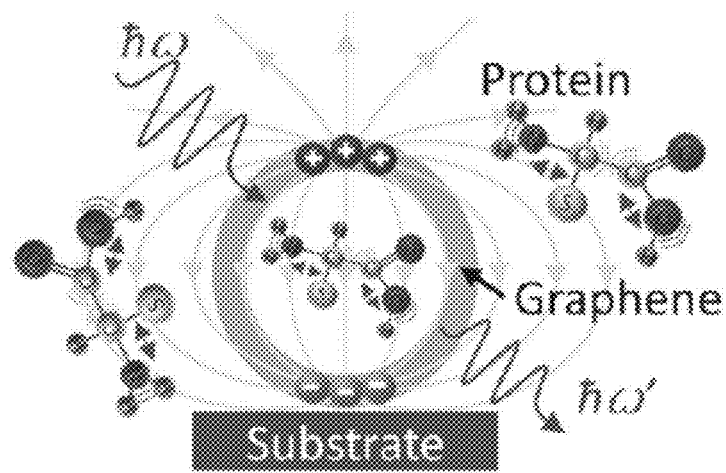
FIG. 20 is a schematic representation of a sensing mechanism of a 3D graphene-based micro- or nanocylinder sensor of the present disclosure.

The presence of biological analytes introduces changes in the frequency spectrum of graphene by (i) shifting the LSPR frequency based on the permittivity of the targeted molecules, and (ii) adding absorption peaks corresponding to the vibrational fingerprint of molecules. Any targeted molecules brought within the LSPR enhanced electric field cause a shift in the LSPR resonant frequency proportional to the relative permittivity (concentration) of the molecule-graphene coupled system. Furthermore, the strong plasmonic field lead to a higher total absorbed power by the targeted molecules if the frequency of the LSPR matches the molecular vibration frequencies, resulting in strongly enhanced absorption peaks in the IR spectroscopy spectrum of these molecules corresponding to their unique molecular fingerprints. FIG. 20 schematically illustrates the sensing mechanism in a 3D graphene-based nanocylinder structure (or 3D graphene optical sensor) in accordance with principles of the present disclosure. To analyze the performance of the 3D graphene nanocylinders of the present disclosure (e.g., the half-way curved, nearly complete cylinder with 1% gap, and complete cylinder described above) as biological sensors as compared to a 2D graphene nanoribbon structure, the shift in the LSPR frequency was simulated as a function of increasing relative permittivity of the molecules inside the nanocylinder, representing changes in concentration and presence of targeted analytes. Larger shifts in resonant frequency (higher sensitivity) with changes in permittivity were found for the curved 3D graphene nanocylinders as a direct consequence of their strongly coupled plasmon resonance. The 3D graphene completely curved nanocylinder demonstrates a significantly higher shift on varying the permittivity of the cylindrical channel between 1 and 8 with an average slope that was five times higher than the slope computed for the 2D graphene nanoribbon. Moreover, the permittivity for most biological specimens is <4, where the average slope for the completely curved 3D graphene nanocylinder was 12-8 times higher than the slope for the 2D graphene nanoribbons. The sensitivity of the graphene-based plasmonic sensors is a strong function of the interface created between the targeted material and the sensor surfaces. The 3D graphene nearly completely curved nanocylinder and the 3D graphene completely curved nanocylinder form a circular interface encapsulating the targeted material resulting in a higher slope as compared to the linear interface associated with a 2D graphene nanoribbon. With the simulations, the height of the "channel" formed on top of the 2D graphene nanoribbon and inside of the 3D graphene halfway curved nanocylinder was selected match the volume of targeted material inside the simulated 3D graphene completely curved nanocylinder. The 3D graphene half-way curved nanocylinder was found to have a sensitivity that is twice that of the 2D graphene nanoribbon.

Figure 21:
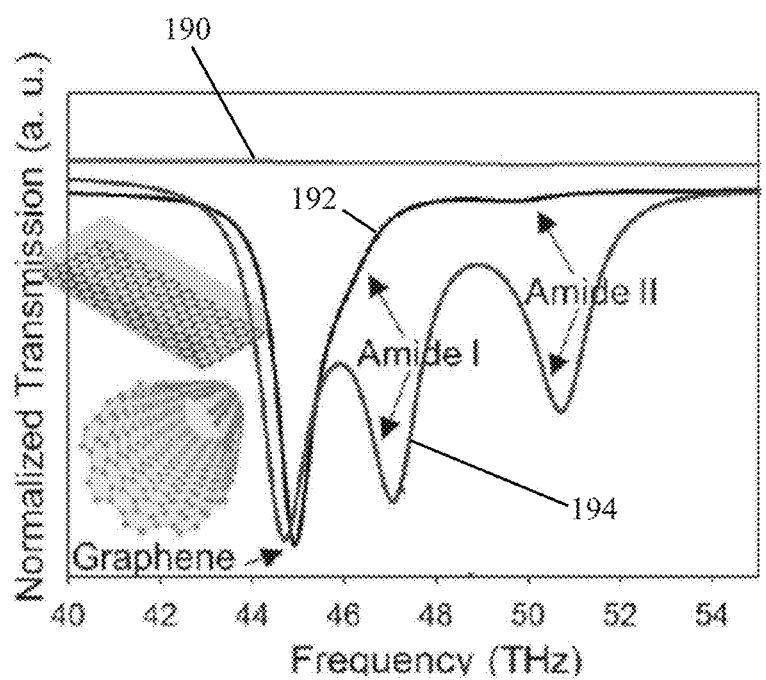
FIG. 21 is a plot of the transmission spectra of simulated 2D graphene nanoribbon and a simulated 3D graphene nanocylinder in the presence of protein A/G molecules.

FIG. 21 presents a comparison of simulation transmission spectra of a 2D graphene nanoribbon and a 3D graphene completely curved nanocylinder of the present disclosure in the presence of protein A/G molecules with peaks corresponding to amide I and II bands and graphene plasmon resonance (the normalized transmission (y-axis) in FIG. 21 is an arbitrary unit ("a. u.")). The protein permittivity was calculated from the Lorentzian model, where the amide bands show a transition peak in the frequency dependent permittivity. The small absorption of the electric field due the large mismatch between the size of the protein and the wavelength of light corresponding to amide fingerprint frequency necessitates the enhancement of the incident electric field by graphene plasmons to transduce measurable amide peaks in the frequency spectrum. To achieve spectral overlap with the amide frequency, for the simulations the 2D graphene nanoribbon was a graphene nanoribbon with a width of 100 nm, and the 3D graphene nanocylinder was a nanocylinder self-assembled from a graphene ribbon of width 100 nm and on a silicon substrate with refractive index of 3.48. The Fermi level for the 2D graphene nanoribbon was increased to 1.5 eV to match the frequency of the amide bands; the Fermi level of the graphene nanocylinder was 0.4 eV to achieve spectral overlap with the amide bands. The smaller width of the 2D graphene nanoribbon results in a larger field enhancement at the corners; however, the rapid decay of the enhanced field away from the graphene surface provides lower interaction with bulk volume of protein as compared to the bulk volume within the channel of the 3D graphene nanocylinder. In FIG. 21, the performance of the graphene nanocylinder and graphene nanoribbon are compared by computing the normalized amplification of the amide I and amide II peaks. The absorbance values of the amide peaks was divided by the absorption of the corresponding graphene structure to find the normalized amplification. Plot line 190 is the transmission spectra for the protein without any graphene field enhancement; plot line 192 is the transmission spectra of the 2D graphene nanoribbon in the presence of the protein; plot line 194 is the transmission spectra of the 3D graphene nanocylinder in the presence of the protein. The strong field enhancement within the 3D graphene nanocylinders causes dips in the transmission spectra due to absorption of the enhanced EM field by the proteins at the frequencies of the amide I and II bands. On the other hand, the transmission spectra of the proteins placed near the 2D graphene nanoribbon do not show any significant signatures of the protein absorption due to a very low spectral overlap between the graphene plasmon resonances and the protein amide I and II bands. The sharp, stronger amplitude peaks for the amide bands in the 3D graphene completely curved nanocylinder are more than an order of magnitude stronger as compared to the 2D graphene nanoribbon and implicate significantly superior detection limits.

From the above explanations, diverse 3D graphene architectures are provided in accordance with principles of the present disclosure, such as pyramid, cube and cylindrical tube with dimensions ranging, for example, from 200 μm down to 500 nm. For each of the architectures, as the size of the 3D structure is reduced, the plasmon wavelength also decreases thereby increasing the resonant frequency and exponentially increasing the near-field enhancement that can be obtained as a result of the strong confinement of the incident field by the graphene plasmon resonance. Even though all of the three architectures and the base 2D graphene ribbon demonstrate a similar trend with varying plasmon wavelength, the diverse shapes and number of faces for each of the 3D architectures induce distinct plasmon hybridization modes and unique field modifications when varying the ratio of dimensions comprising the 3D shape (e.g., L/W ratio). For example, the tapered slant surfaces of the pyramid shape induce an extreme point based enhancement at the apex of the pyramid similar to the corners of the 2D ribbon. The strong point based enhancement is also experienced in a 3D graphene tube. The maximum enhancement is not concentrated to a single point in the tube architecture, but rather extends to the entire edge at the end openings of the tube. For the 3D pyramid, a similar (although lower) edge based enhancement is induced for TE mode excitation that creates a strong field at the base of the pyramid and not at the apex.

Figure 22:
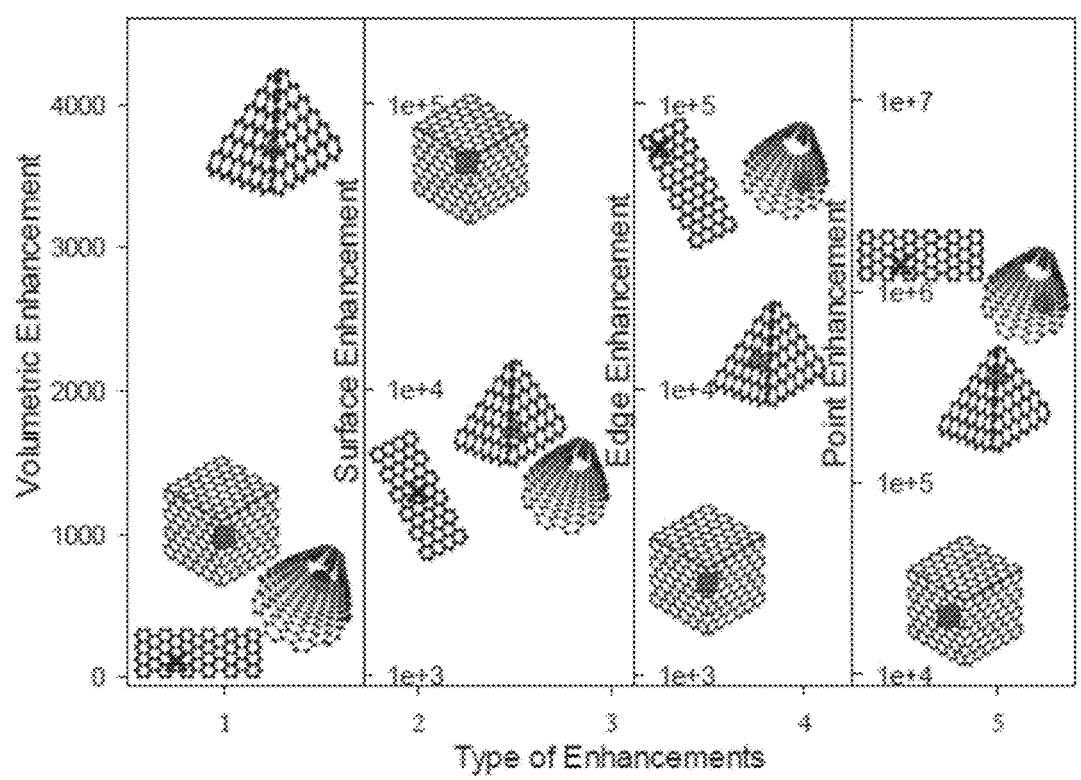
FIG. 22 provides a comparison of various near-field enhancement parameters for differently-shaped 3D graphene optical sensors in accordance with principles of the present disclosure and a 2D graphene ribbon.

The 3D graphene cube does not demonstrate a strong point and edge based enhancement as compared to other 3D graphene architectures. However, the hotspot created in the 3D cube in the direction perpendicular to the incident electric field induces a strong and uniform field enhancement with a large area. For the 3D graphene pyramid under TM excitation, the uniform interference from the slant edges of the pyramid renders the base of the pyramid with a higher near-filed enhancement as compared to the slant edges and the cylindrical tube. Furthermore, the existence of large hotspot surfaces in the cube, and the base-apex coupling in the pyramid creates a strong field within the volume of both structures. Thus, extending the conventional point and edge limited plasmonic field enhancements to large surface areas and volumetric field. These features are summarized in FIG. 22 that presents comparisons of the highest intensity of the volumetric, area-based, edged-based, and point-based near-field enhancement that can be obtained for the hollow 3D graphene pyramid, cube, tube and 2D graphene ribbon in accordance with some embodiments of the present disclosure. The summary of FIG. 22 demonstrates that the coupling between the slant surfaces and the interference of the fields between the apex and base of the pyramid render it with the strongest volumetric enhancement, followed by the cube owing to its large hotspot surfaces, then the tube with the virtual cross-sectional area of uniform enhancement, and lastly the 2D ribbon with minimal volumetric enhancement. As a point of reference, the integral for the volumetric field in the 2D ribbon was carried out for the same volume of air above the ribbon as that required for the volume to be equal to the cylindrical tube. The strongest area-based enhancement occurs in the 3D cube owing to the large hotspot surfaces created by uniform plasmon hybridization, followed by the 3D pyramid and cube, and final the 2D ribbon. In contrast, the strongest edge-based enhancements were obtained for the 3D cylindrical tube and 2D ribbon with minimal variations that were primarily caused by the variations in periodicity and mesh size. Furthermore, the edge-based enhancement in tube and ribbon is followed by that in the pyramid and lastly the cube which demonstrate lower edge-based enhancement since their maxima are spread out over large hotspot surfaces. Finally, the maximum scattered electric field (i.e., point-based enhancement) occurs in the 3D cylindrical tube, 2D ribbon, followed by the pyramid and lastly the cube.

From the above, some aspects of the present disclosure provide differing 3D architecture graphene sensors that can be used for a diverse range of applications that extend the capabilities of plasmonic devices by leveraging the distinct plasmonic modes that can exist in each of the 3D structures. The strong point-based field confinement in the cylindrical graphene tubes and at the apex of the pyramid can be utilized, for example, for deposition of receptors that are needed to monitor target molecules of higher and known concentrations. The small diameter micro- or nanotubes (e.g., D=32 nm) can also allow utilizing the virtual cross-sectional area of uniform near-field enhancement for detection of analytes as they flow within the tube. The large hotspot and volumetric enhancement that exist in 3D graphene pyramid and cubes can be beneficial at extremely small femto and atto molar concentrations of unknown targeted molecules. At these minute concentrations, the use of point- and edge-based plasmonic field enhancement may fail in the detection of the targeted specimens due to limitations imposed by the diffusion of particles to the enhanced edge and corners. The dimensions of the surfaces and edges comprising the 3D architectures of the present disclosure can be further controlled to obtain desired hybridized plasmonic resonances.

Some of the methods for fabricating 3D graphene-based nanocylinders of the present disclosure use a plasma triggered self-assembly process without sacrificing the unique physical properties of the 2D graphene material. By designing the desired width, length, and shape of the graphene nanoribbons, 3D graphene nanocylinders with an aspect ratio of 10,000 and twisted nanocylinders have been realized. In some embodiments, the self-assembly process incorporates the physical properties of pristine graphene into the 3D architecture, which induces novel optical properties stemming from the uniquely out-of-plane coupled plasmon modes that cannot be observed in 2D structures defined on a planar substrate. The radial coupling of plasmons induces a uniform circular cross-sectional area of extreme near field enhancement at the openings of the 3D nanocylinders. The edge-edge coupling and edge-substrate coupling with minimal spatial contact between the graphene and the substrate in the 3D graphene partially curved nanocylinders induce a propagating edge mode throughout the length of the cylinder with an electric field that is 4 orders of magnitude stronger than in 2D graphene ribbons. Further, simulation of different 2D and 3D graphene structures show at least five times higher shifts in resonant frequency and more than an order of magnitude stronger molecular absorption peaks achieved by some of the 3D graphene nanocylindrical sensors of the present disclosure as compared to 2D graphene ribbon-based sensors even in the absence of the added benefits from low substrate damping. The unique spatial coupling within 3D structures extends the near field enhancement into the bulk cross-sectional 3D space, allowing the architecture to be utilized for the realization of cylindrical plasmonic optofluidic channels that can detect and analyze targeted molecules flowing within them without limitations in sensitivity arising from the need for diffusion of molecules to the surface of the graphene. In some embodiments, the 3D graphene asymmetrically twisted nanocylinders of the present disclosure can be useful for chiral plasmonic optofluidic sensors that can provide more detailed information about chiral biological molecules such as proteins and amino acids as compared to conventional achiral spectroscopy-based sensing techniques using planar graphene.

The 3D graphene optical sensors of the present disclosure can be used as part of an optical sensing systems. The systems can assume various forms and in some embodiments can include a light source and a detector capable of making transmission measurements through the optical sensor. In general terms, light incident on the optical sensor induces a plasmon resonance in the graphene-based membranes which in turn is affected by the interaction of the graphene-based material and the surrounding environment.

Embodiments and advantages of features of the present disclosure are further illustrated by the following non-limiting examples, but the particular materials and amounts thereof recited in these examples, as well as other conditions and details, should not be construed to unduly limit the scope of the present disclosure.

EXAMPLES

In support of the following examples, various optical images are presented.

An optical microscope was used to capture microscale images. A scanning electron microscopy (JEOL 6700) was used to capture nanoscale images. To achieve a good image on the dielectric material and minimize the effect on graphene, a low voltage of 5 kV was used for imaging.

Example 1

Example 3D graphene optical sensors in accordance with principles of the present disclosure were prepared as follows. Graphene layers were formed by first synthesizing CVD graphene on copper foils (25 µm thick copper foil, available from Alfa Aesar under the trade designation 46365). The graphene/copper foils were loaded into a 2 inch diameter quartz tube furnace. After pressure stabilization at 33 mTorr under 16 sccm hydrogen flow, the furnace was heated to 1050° C. and held for 30 minutes to anneal the copper foils. The hydrogen flow was then changed to 21 sccm and mixed with 0.21 sccm methane to allow graphene growth for approximately one hour. The furnace pressure was held at 250 mTorr during the growth stage. Finally, the furnace was cooled to room temperature in hydrogen before removing the films.

The graphene layers were incorporated into 3D structures as follows. A copper sacrificial layer was formed on a silicon substrate. 2D nets with six square $Al_2O_3$/Cr protection layers (the dimension of each square was 150 µm×150 µm) were fabricated on the copper sacrificial layer. The Cr sub-layer had a thickness of 10 nm and was formed on the copper sacrificial layer using photolithography and lift-off metallization; the $Al_2O_3$ sub-layer had a thickness of 100 nm on the Cr sub-layer using photolithography and lift-off metallization.

For example graphene 3D optical sensors, the graphene layers described above were transferred onto the protection layers and then patterned to form graphene membranes. Since the designed structure for 3D graphene had a width of approximately 200 µm, it was considered that a single layer of graphene might not be strong enough to obtain a parallel production of 3D graphene. Thus, three layers of graphene sheets were applied as a multilayer graphene membrane as follows. After growth of the CVD graphene on copper foil as described above, a thin layer of PMMA was spin coated on a 1×1 inch area of the graphene on the copper foil. The copper foil was then etched using a copper etchant (APS-100 Copper Etchant from Transene Company, Inc., Danvers, Mass.) for twelve hours. The floating, PMMA-coated graphene layer was then transferred onto the protection layer, and the PMMA was removed in acetone for 30 minutes at 60° C. On top of the so-transferred graphene layer, another graphene layer was transferred by the same method, followed by transfer of the third graphene layer by the same process to obtain a membrane of three stacked graphene layers. To pattern the so-formed graphene membranes (same sized windows), a positive photoresist (Microposit® S1813, distributed by MicroChem Corp., Newton, Mass.) was spin-coated followed by baking at 115° C. for 60 seconds. The unwanted area of graphene was UV exposed on a contact mask aligner for 15 seconds and developed for 60 seconds in a developer (Microposit® MF®-319 developer, distributed by MicroChem Corp., Newton, Mass.), followed by an oxygen plasma treatment. The leftover photoresists were removed by acetone at 60° C. for 30 minutes. Frames comprising an epoxy material (photodefinable epoxy SU-8 available from MicroChem Corp., Newton, Mass. under the trade designation 2010) were then patterned over the graphene membranes using standard lithography. A 5 µm thick SU-8 epoxy was spin-coated (2500 rpm for 60 seconds) and baked at 90° C. for 2 minutes. The samples were then UV exposed for 20 seconds, baked at 90° C. for 3 minutes, and developed for 60 seconds in an SU-8 developer (obtained from AZ Electronic Materials). Then the samples were post-baked at 200° C. for 15 minutes. To generate the hinge pattern, 1 10 µm thick polymer film (Megaposit™ SPR™ 220 from MicroChem Corp., Newton, Mass.) was spin-coated (1000 rpm for 60 seconds) on top of the fabricated substrate, followed by baking at 115° C. for 60 seconds. The sample was then exposed on a contact mask aligner for 80 seconds and developed for 90 seconds in a developer (obtained from AZ Electronic Materials). The resultant 2D net was released and transitioned through self-assembly as described below.

Figure 23:
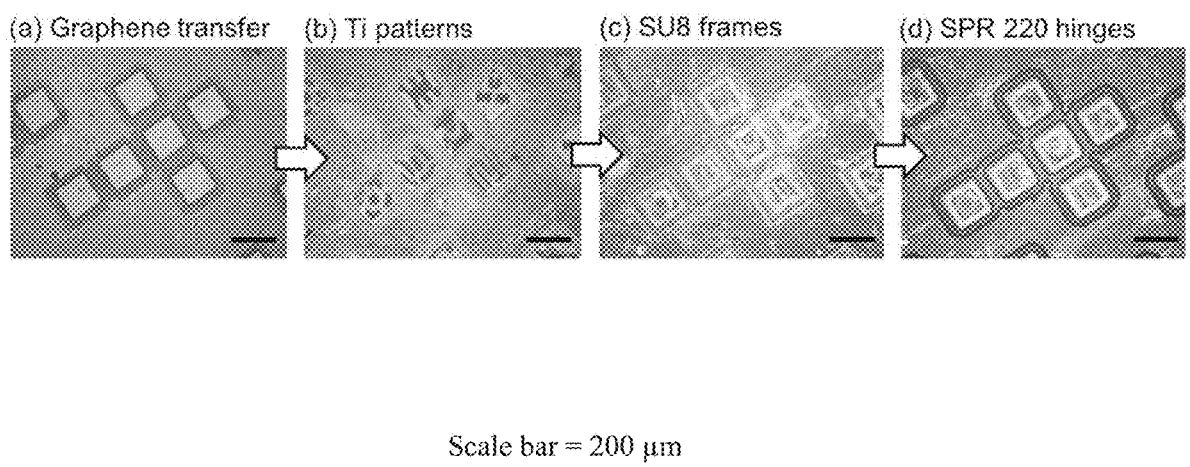
FIG. 23 provides optical images depicting formation of a 2D net with graphene membranes and metal patterns described in the Examples section.

For example functionalized graphene 3D optical sensors, samples with graphene membranes transferred onto the protection layers were prepared as described above. On top of the graphene membranes, 20 nm thick Ti metal patterns were deposited by a lithography and lift-off process. For all samples, the SU-8 frame was then formed as described above. The gap between the frames was 20 µm. The polymer hinges were then formed at the frame intersections as described above. FIG. 23 presents optical images of the fabrication of graphene membranes, Ti patterns, frames and hinges. For all samples, the resultant 2D net was released and transitioned through self-assembly as described below.

Figure 24:
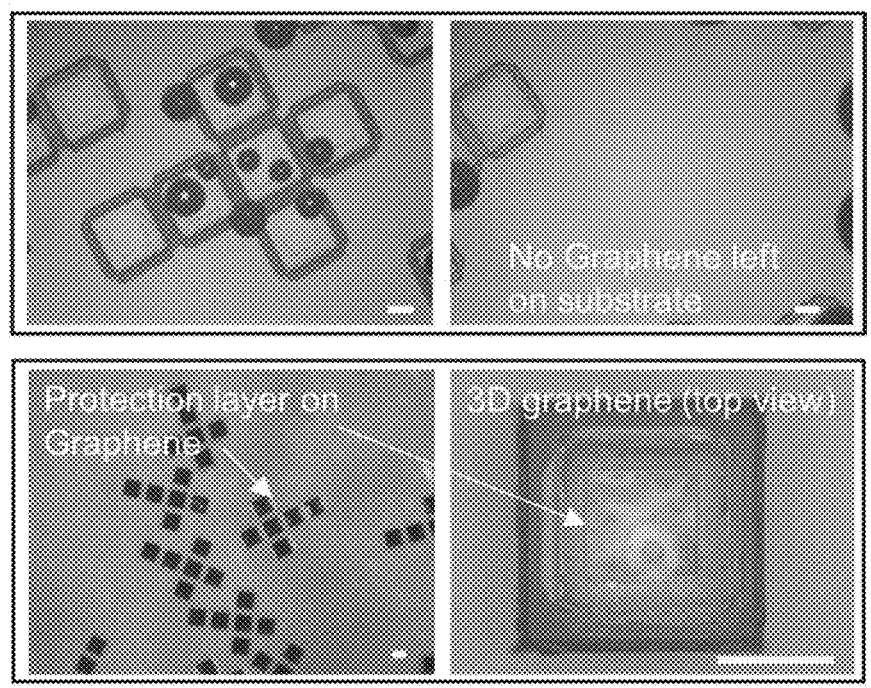
FIG. 24 provides optical images depicting formation of a 3D structure from a 2D net with graphene membranes described in the Examples section.

With each of the 2D net samples described above, after being precisely assembled on the 2D planar substrate, the copper sacrificial layer was dissolved in an appropriate copper etchant to release the 2D net. In each instance, the released, free-standing 2D net was transferred into water and rinsed a few times to remove the residual etchant. The released 2D net was then heated in water above the melting point of the polymer hinges (approximately 80° C.). As a result of polymer melting (or reflow), a surface tension force was generated, inducing a self-assembly process that transformed the structures from 2D nets into 3D structures. As a point of reference, the surface tension torque was generated by the reflow of the hinges to fold the 2D net structure. Since the surface tension of the polymer hinges (approximately 0.003 N/m) is lower than metal (e.g., solder approximately 0.5 N/m), less tension torque was required to self-fold up the 2D nets as compared to 2D nets using metal hinges. In other words, such a low required torque was viewed as reducing stress on the membranes during the self-folding process (as compared to metal), and the temperature required to induce self-folding with polymer hinges was much lower than that associated with metal hinges (e.g., in the case of tin, the melting point is 230° C.). Finally, the remaining $Al_2O_3$/Cr protection layers were removed by a Cr etchant (hydrochloric acid etchant (Chromium Etchant CRE-473 from Transene Company, Inc., Danvers, Mass.)), resulting the final 3D graphene-based optical sensor examples. FIG. 24 presents optical images of the self-assembly of the graphene-based 3D optical sensor in accordance with the Examples section.

It was observed that the frames of the microscale cubic structures of the Examples described above were made of SU-8 photoresist, which is a common material directly used for structural materials during nano/microfabrication due to its high mechanical and thermal stability. The thermal stability of SU-8 largely depends on the cross-linking process of the SU-8. A hard-bake of over 200° C. enabled the maximum cross-linking of the SU-8, resulting in an improved thermal stability of the structures. The mechanical stability of the cubic structures was determined to also depend on the hard-baking temperature of the SU-8. The dynamic modulus of SU-8 improves after hard-baking, and it was determined that the structures have more mechanical strength during dynamic motion and thus are more mechanically stable. It was observed that the cubic structure maintained an original shape up to 300° C., which is the maximum temperature applied for the test of mechanical stability. In addition, the deposition of metal Ti patterns creates an intrinsic compressive stress on the corresponding graphene membrane; however, unbroken graphene membranes of the sample graphene 3D optical sensors of the Examples section indicated the mechanical stability of the 3D graphene membranes defined on 200 µm sized cubic structures.

Before and after self-assembly, material properties of the 3D graphene structures of the Examples section were characterized using a Raman spectra to investigate the effect self-assembly might have on the graphene's properties. For confocal measurement, a Witec alpha300 R Raman microscope with UHTS300 spectrometer and DV401 CCD detector was used. The laser in the system was a monochrome Argon ion laser with 514.5 nm excitation and 50 mW maximum power output power. To measure the pristine graphene, the graphene samples were directly put onto a highly linear, piezo-driven, feedback controlled scan stage, which is use as the sample holder and can be moved in the X- and Y-axes. Then the confocal Raman microscope was precisely focused on the graphene by using a 10× Olympus objective and a 100× Nikon oil immersion objective. For the graphene samples before and after self-assembly, a pipette was used to take the samples out from the water and dropped them onto glass slides separately. After water around samples were evaporated at room temperature, the samples were put on the scan stage and the microscope was well focused on the graphene windows of the 2D and 3D samples. For the 3D samples, the microscope was only focused on the top windows of the cubic structures. After focusing, the laser was turned on to conduct the Raman measurement. During the mapping measurement, the system was set to capture four data points every 1 μm to achieve the maximum resolution. The Raman mapping result was plotted based on the intensity of G or 2D band. For the data collection and analysis, Windows-based WitecControl 1.38 software was used. The spectroscopy was performed between 1200 and 3000 $cm^{-1}$.

Figures 25, 26:
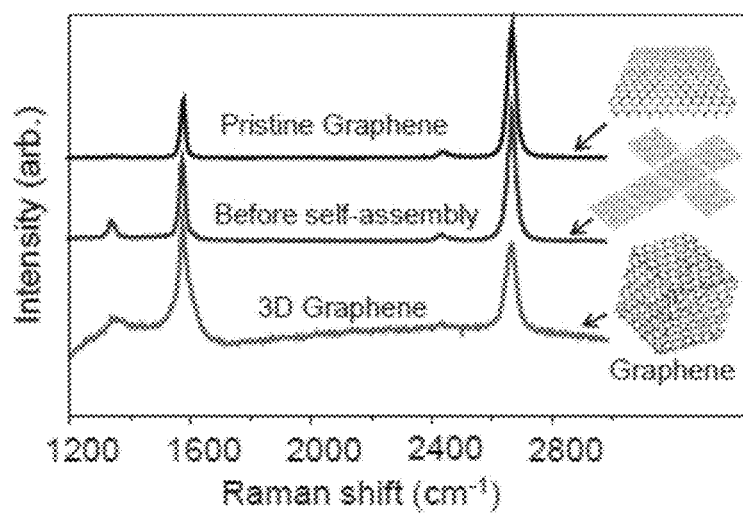
FIG. 25 is a graph of Raman spectroscopy of 2D and 3D graphene structures described in the Examples section.
FIG. 26 is a table summarizing the data of FIG. 26 described in the Examples section.

For a comparison of the properties of the graphene membrane, the following were measured: (i) a pristine single layer graphene membrane; (ii) multilayer, 2D, patterned, free-standing graphene membranes transferred onto an SU-8 frame with a hinge, which is the step before self-assembly; and (iii) self-assembled, 3D graphene structures. The obtained Raman spectroscopy information is plotted in FIG. 25 and summarized in FIG. 26. As a point of reference, intensity (y-axis) in FIG. 25 is an arbitrary unit ("arb.") and values always change depending on measurement conditions (the y-axis does not directly refer to the intensity), and the plots of FIG. 25 are useful in evaluating the locations of peaks and the ratio between peaks. As shown, the transferred single layer of graphene on a Si substrate shows two distinct peaks; a G band near 1587.6 $cm^{-1}$ and a 2D band near 2690.3 $cm^{-1}$. After the transfer and patterning of the graphene on the protection layer, a D band near 1342.9 $cm^{-1}$ appeared. This observation might be attributed to the few disorders or defects (e.g., wrinkles and/or ripples) induced during the multilayer stacking process. There may also have been PMMA residue between the stacked layers of graphene membranes which can contribute to the increases of the D band. A red shift in the G band (1580.9 $cm^{-1}$) and fixed the 2D band (2690.1 $cm^{-1}$) were also found. Such red shift in G bands has been observed with increases in the number of graphene layers or misaligned stacked graphene layers.

For the 3D graphene, results showed (i) increases in the intensity of the D band to G band ratio ($I_D/I_G$); (ii) broadening of the G and 2D peaks; and (iii) red shifts in the D, G, and 2D bands. The $I_D/I_G$ increased from 0.52 to 0.65; these increases are not significant and the value is comparable to other CVD graphene multilayer sheets. Some defects may be induced during the self-folding. The broadening of the peaks is presumably due to the overlapping of signals from the top and bottom of graphene membranes (or faces) on a 3D graphene cube. Similar broadening of the G peak has also been observed in rolled-up monolayer graphene. The red shift in the G and 2D bands is due to the free-standing nature of graphene membranes after being self-folded.

Figure 27:
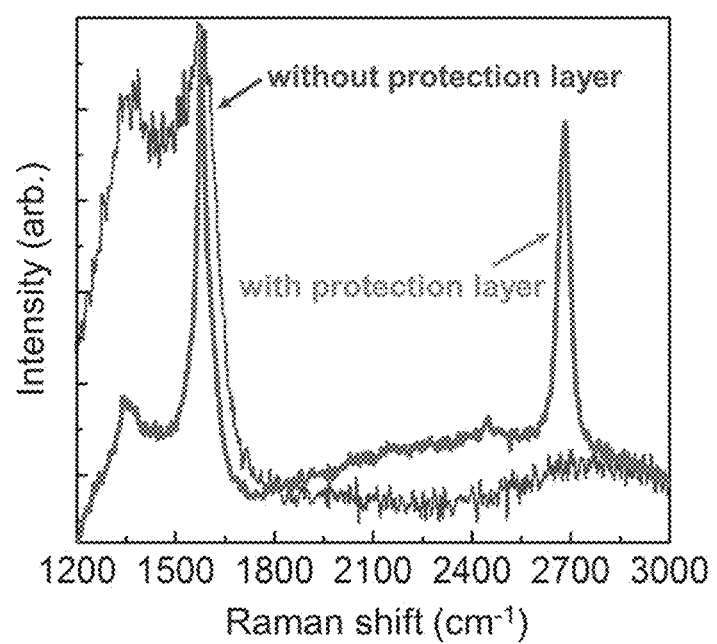
FIG. 27 is graph of Raman spectroscopy of 3D graphene structures with and without a protection layer described in the Examples section.

Peaks appeared at the D band near 1338.8 $cm^{-1}$, at the G band near 1576.9 $cm^{-1}$ and at the 2D band near 2683.1 $cm^{-1}$. It is known that free-standing graphene is inherently crumpled due to static wrinkles and out-of-plane flexural phonons. In addition, in order to check the effects of the use of the $Al_2O_3$ protection layer, Raman spectra with and without the use of the protection layer was measured. As shown in FIG. 27, before use of the protection layer, graphene membranes were damaged during the self-folding, resulting in higher D band and lower 2D band. As a point of reference, intensity (y-axis) in FIG. 27 is an arbitrary unit ("arb."), and the plots of FIG. 27 are useful in evaluating the locations of peaks and the ratio between peaks. These observations indicate that the self-folding process did not create significant changes in graphene structures, demonstrating the robustness of the reported methods.

Example 2

Figure 28A:
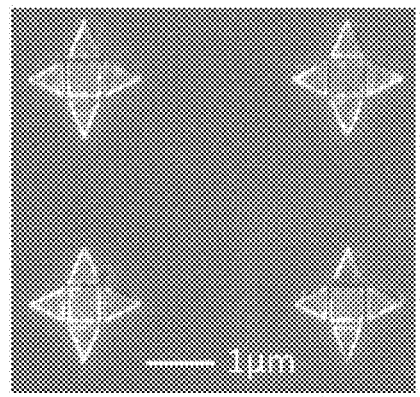
FIGS. 28A-28D provide optical images depicting formation of a 3D graphene pyramid optical sensor described in the Examples section.
Figure 28B:
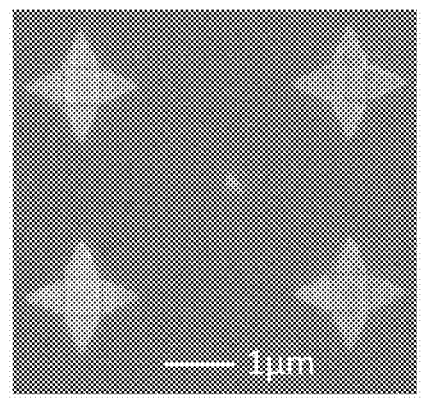
Figure 28C:
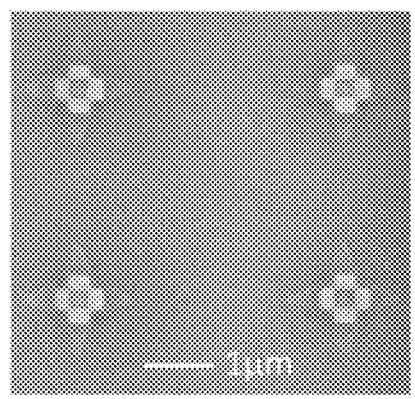

Example 3D pyramid graphene optical sensors in accordance with principles of the present disclosure were fabricated by forming a 2D pattern consisting of a protection layer of five, 10 nm thick $Al_2O_3$ panels defined on top of a high resistivity silicon substrate through electron-beam lithography (EBL) process as shown in FIG. 28A. The central square panel had a dimension of 500 nm×500 nm and was separated from the surrounding triangular panels by a 50 nm gap. A single layer of CVD graphene was then transferred on top of the $Al_2O_3$ layers through a wet graphene transfer process. A second protection layer of 50 nm thick $Al_2O_3$ panels, with the same dimensions as the first $Al_2O_3$ panels, was patterned on top of the graphene through an EBL process which aligned it precisely with the first or bottom $Al_2O_3$ layer as shown in FIG. 28B. The two protective layers of $Al_2O_3$ were used to prevent damage to the graphene during subsequent processing (that might otherwise cause loss of plasmon behavior). An oxygen plasma etching processes was then carried out in a reactive ion etching (ME) system (STS 320) to remove undesired graphene. 200 nm thick PMMA was spin coated on top of the structures to form the hinges (used for self-folding), with dimensions of 150 nm×350 nm defined through an EBL process as shown in FIG. 28C. After developing, the sample was treated with $CF_4/O_2$ plasma in an RIE system to etch the Si substrate underneath the four triangular panels. In order to protect the PMMA hinge from being etched away, the sample was placed face down in the chamber to eliminate the etching effect from ion bombardment.

Figure 28D:
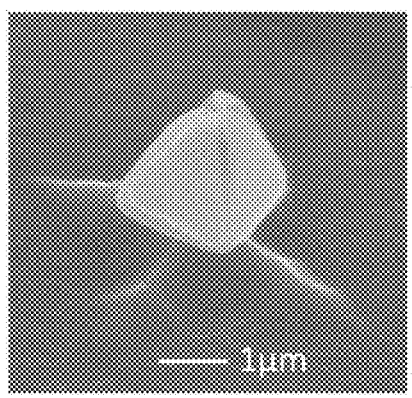
Figure 29:
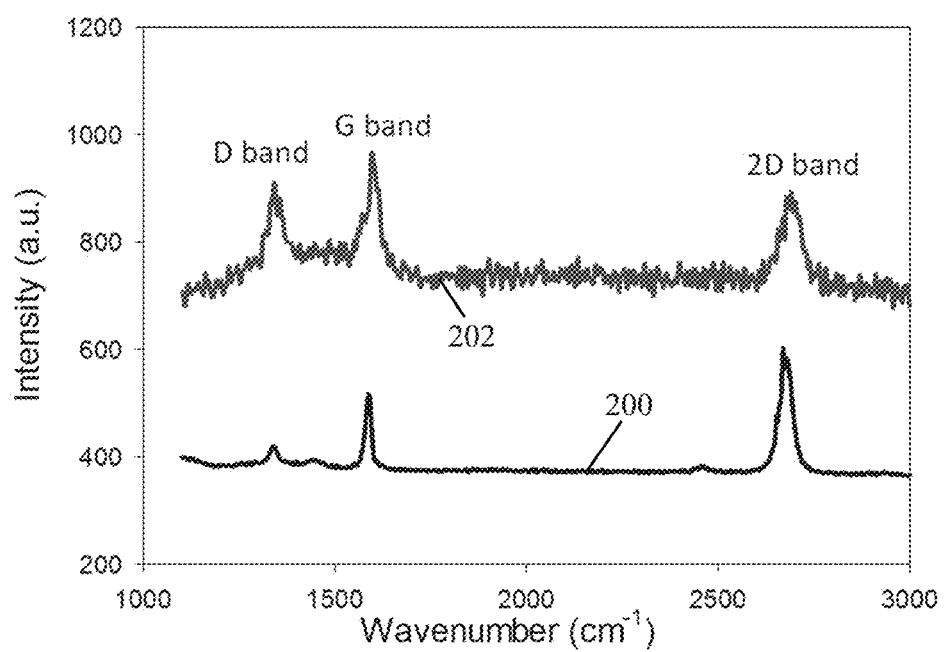
FIG. 29 is a graph of Raman spectroscopy of 2D and 3D graphene structures described in the Examples section.

The so-constructed 2D samples were then caused to self-assemble by placing on a hot plate at 300° C. for one hour. During the heating process, the temperature exceeded the glass transition temperature of the polymer and triggered polymer reflow in the hinges. As a result, a surface tension force was generated by the hinge towards the center of the 2D pattern, folding the surrounding triangular panels out of plane to form the 3D pyramid structure as shown in FIG. 28D. Raman images were taken for the structure both before and after the self-assembly process and are reported at FIG. 29 (i.e., the Raman spectra captured for the 2D graphene structure on the silicon substrate before self-assembly is shown at plot line 200, and the Raman spectra captured for the 3D graphene pyramid on the silicon substrate after self-assembly is shown at plot line 202). As a point of reference, intensity (y-axis) in FIG. 29 is an arbitrary unit ("a. u."), and the plots of FIG. 29 are useful in evaluating the locations of peaks and the ratio between peaks. The spectra retains the 3 peaks corresponding D band (1338 $cm^{-1}$), G band (1598 $cm^{-1}$), and 2D band (2690 $cm^{-1}$). The Raman image based on the G band of graphene demonstrates a clear transformation in the shape of the structures before and after self-assembly, providing conclusive evidence of conservation of graphene properties during the fabrication process. Further information can be achieved by analyzing the full Raman spectrum. As the intensity of both the G band and 2D band was high even after self-assembly, it shows that graphene was in good condition and not etched away. Compared to pristine graphene, a strong D band could be observed after self-assembly, which could be attributed to the stress induced in the self-assembly process and should not cause significant change in the graphene properties.

Example 3

Figure 30A:
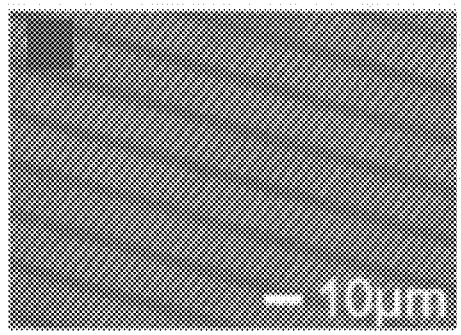
FIGS. 30A-32B provide SEM images depicting formation of 3D graphene nanocylinders described in the Examples section.

Example 3D cylindrical tube graphene optical sensors in accordance with principles of the present disclosure were fabricated by methods in accord with FIGS. 5A-5F and corresponding descriptions above. First, a 2D sandwiched graphene ribbon or net (3 nm aluminum oxide ($Al_2O_3$)/ graphene/3 nm $Al_2O_3$/5 nm tin (Sn)) was fabricated on a high resistivity silicon (Si). PMMA (A3) was spun at 3000 RPM on top of the high resistivity silicon as the electron beam (E-beam) resist. An array (30×100) of 2D graphene-based ribbons or nets, each with dimensions of 1.5×1.5 μm, was then defined on the PMMA by an electron beam lithography (EBL) system (Vistec EBPG5000+). After developing in MIBK: IPA with the ratio of 1:3 for 1 minute, 3 nm $Al_2O_3$ was deposited by an electron beam evaporator (RME-E2000) to form the bottom protection layer or frame. A lift-off process was carried out in acetone to remove undesired material. Next, a single layer of chemical vapor deposited (CVD) graphene was deposited on top of the patterned $Al_2O_3$ ribbon through a wet transfer process. After graphene transfer, N2403 was spun on top of the structure at 5000 RPM as the negative E-beam resist (able to protect graphene from electron irradiation for the rest of the EBL process). Then, a secondary array of 2D ribbons with the same dimension (1.5×1.5 μm) was defined on the N2403 resist, and was aligned precisely to the bottom protection layer. MF 319 was used as the developer (able to dissolve the unexposed resist in 1 minute). Then, 3 nm $Al_2O_3$ and 5 nm Sn were deposited by an electron beam evaporator to form the top protection layer or frame and sacrificial layer, respectively. Next, the unwanted graphene, which was not otherwise protected by the Sn and $Al_2O_3$ was removed by an oxygen plasma treatment in a reactive ion etching (RIE) system (STS 320) as shown in FIG. 30A. After fabrication of the 2D sandwiched graphene ribbons or nets, reactive ion etching (RIE) with $CF_4/O_2$ was used to achieve self-assembly of a 3D graphene nanotube structure. During this process, both chemical reaction between the fluorine atoms and Si substrate and the physical ion bombardment on the Si substrate contributed to etching of the Si underneath the graphene sandwich structures. As a result, the graphene sandwich structures released from the Si substrate. Simultaneously, both the physical and chemical reaction generated thermal energy that melted the Sn, triggering grain coalescence. As a result of the grain coalescence, a surface tension force was induced, folding the 2D structure out of plane to form partially curved graphene-based nanocylinders and, with further self-assembly time, completely curved graphene-based nanocylinders. The Sn layer was selectively etched away from the so-formed sample graphene-based nanocylinders in nitric acid after self-assembly (the nitric acid etched only the Sn layer without etching $Al_2O_3$ or graphene).

In the sandwiched structure, the two layers of $Al_2O_3$ worked as frames supporting the graphene as well as protection layers, shielding the graphene from being damaged by the subsequent etching process during self-curving. The Sn layer served as an actuation layer, generating surface tension forces for self-curving during the plasma-triggered self-assembly process in the reactive ion etching (RIE) system with $CF_4/O_2$.

Figure 30B:
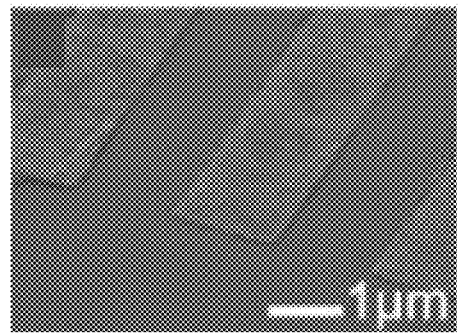
Figure 31A:
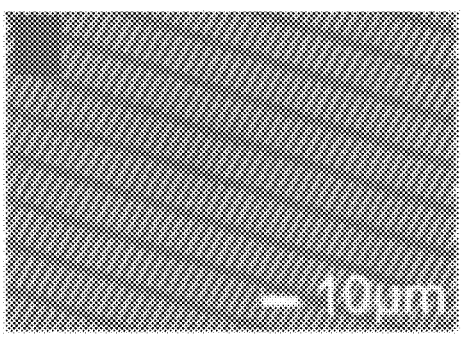
Figure 31B:
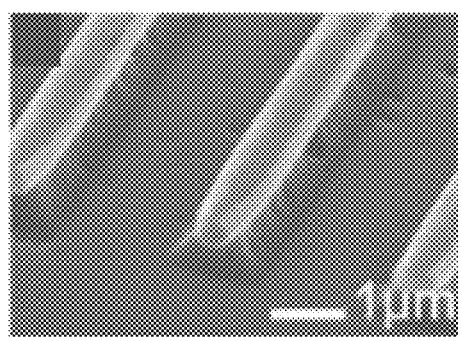
Figure 32A:
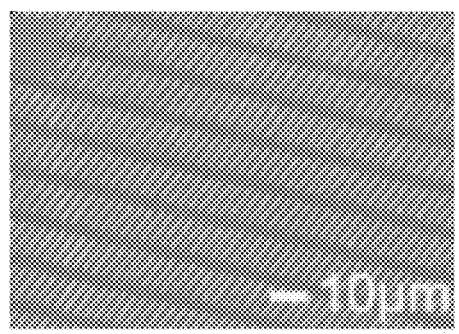
Figure 32B:
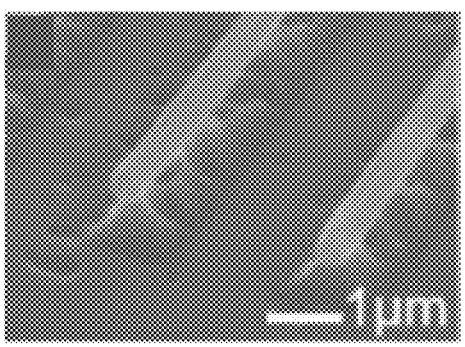

FIG. 30A is an SEM image of the array of graphene-based nanoribbons prior to the self-curving process; FIG. 30B is an enlarged portion of the SEM image of FIG. 30A showing one of the graphene-based nanoribbons in greater detail. FIG. 31A is an SEM image of the array of FIG. 30A following the initial self-assembly time resulting in 3D graphene-based partially curved nanocylinders; FIG. 31B is an enlarged portion of the SEM image of FIG. 31A showing one of the 3D graphene-based partially curved nanocylinders in greater detail. FIG. 32A is an SEM image of the array of FIG. 30A following additional self-assembly time resulting in 3D graphene-based completely curved nanocylinders; FIG. 32B is an enlarged portion of the SEM image of FIG. 32A showing one of the 3D graphene-based completely curved nanocylinders in greater detail. A yield of self-curving of about 100% was achieved for the 30×100 array, and the yield was not affected by the number of arrays since the self-curving was a parallel process.

The Witec alpha300R Confocal Raman microscope described above was used for Raman measurement to characterize the graphene quality. For detection of the signal, a UHTS300 spectrometer and DV401 CCD detector was used. During measurement, the samples were mounted on a highly linear, piezo-driven, feedback-controlled scan stage, that could be moved in X and Y directions with a positional accuracy of 5 nm. For spectral measurement, the laser was carefully focused on the sample in question. For Raman Mapping measurement, the mapping area was set up to be 20×20 μm² with a resolution of 250 nm (the optical resolution of the system). The Raman images were generated based on a G band intensity between 1560 cm$^{-1}$ and 1600 cm$^{-1}$. After measurement, Project FOUR software was used to analyze data and plot the spectrum.

Figure 33:
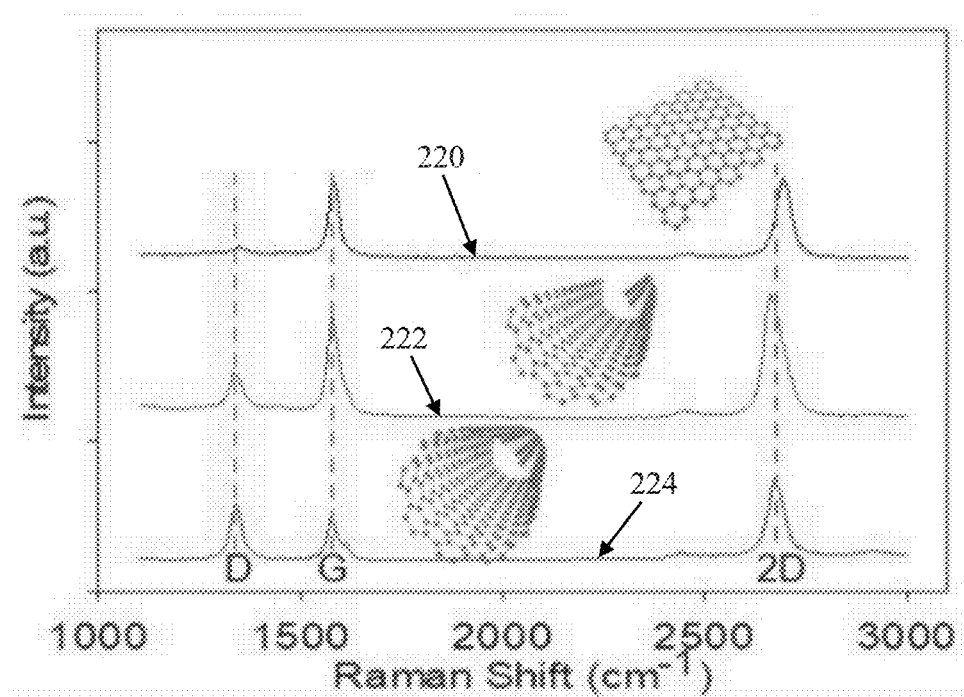
FIG. 33 is a graph of Raman spectra of a 3D graphene nanocylinder described in the Examples section and at the stages of self-assembly reflected in FIGS. 30A-32B.

To verify that the graphene was protected during the self-curving or self-assembly process, the properties of graphene before and after self-assembly were characterized by Raman spectroscopy as described above and the results are reported at FIG. 33 (2D graphene nanoribbon is plot line 220, 3D graphene halfway folded or curved nanocylinder is plot line 222, and 3D graphene completely folded or curved nanocylinder is plot line 224). As a point of reference, intensity (y-axis) in FIG. 35 is an arbitrary unit ("a. u.") and values always change depending on measurement conditions (the y-axis does not directly refer to the intensity), and the plots of FIG. 35 are useful in evaluating the locations of peaks and the ratio between peaks. In single layer graphene, the most prominent peaks were the G band (approximately 1580 cm$^{-1}$) and 2D band (approximately 2690 cm$^{-1}$). In the Raman spectra collected from the samples of Example 3, both dominant peaks of graphene (i.e., the G and 2D bands) were observed, confirming that no critical damage was induced in the graphene. After self-assembly, the D band (approximately 1350 cm$^{-1}$) peak, representing defect and lattice disorder, appears and is stronger for samples with longer self-assembly times. In the 3D partially or completely curved graphene nanocylinders, the defects could be attributed to the increased density of edge defects and lattice disorder caused by stress or wrinkles induced during self-assembly. After self-curving, the edges of the ribbons curve towards the middle of the cylinder shape and cause a higher density of edge defects and lattice structural stress, leading to a higher D band. To further quantify the defect level, the ratio of the D band intensity ($I_D$) and the G band intensity ($I_G$) was calculated as $I_D/I_G$. The ratio was around 1 (representing low defect regime) for the completely curved graphene nanocylinders. In addition, the $I_D/I_G$ ratio of about 1 is comparable with a lithographically prepared graphene ribbon, which means the properties of graphene are not severely affected by the self-assembly process.

Moreover, Raman images plotted based on G band were collected from samples consisting of entirely 2D graphene nanoribbons, 3D graphene partially curved nanocylinders, and 3D graphene completely curved nanocylinders to evaluate the overall graphene status throughout the structures. The Raman mapping image for the 2D graphene nanoribbons showed ribbon structures with the same dimensions of 1.5 µm×15 µm, indicating the high quality of the fabricated 2D graphene nanoribbons. After partially curved, the structures in the Raman image have the same reduced width as the complete curved nanocylinders shown in the corresponding SEM image. When the graphene nanoribbons self-assembled to a completely curved nanocylinder, a continuous clear Raman image with dimensions of approximately 477 nm×15 µm was still observed, demonstrating that the physical properties of graphene were preserved during the self-assembly because of the graphene being sandwiched between two different 3 nm thick layers of $Al_2O_3$.

Example 4

Example 3D 5-faced cube graphene optical sensors in accordance with principles of the present disclosure were fabricated by a self-assembly process triggered by ion induced polymer reflow as described below to further explore the advantages of graphene. First, a 2D net of five, 10 nm thick $Al_2O_3$ panels (a central panel with four sides, and one panel at each side of the central panel for a total of five panels) was defined on top of a high resistivity silicon substrate through an electron-beam lithography (EBL). Each panel had a dimension of 500 nm×500 nm and was separated from the central panel by a 50 nm gap. Then, a single layer of CVD graphene was then transferred on top of the $Al_2O_3$ layers through a wet graphene transfer process. A second layer of 50 nm thick $Al_2O_3$ panels, with the same dimensions as the first $Al_2O_3$ panels, was patterned on top of the graphene layer through the EBL process which aligned it precisely with the first or bottom $Al_2O_3$ layer. To remove the undesired graphene, an oxygen plasma etching processes was then carried out in a reactive ion etching (RIE) system (STS 320). Next, 200 nm thick PMMA was spin coated on top of the structures followed by an EBL process to define hinges with dimensions of 150 nm×350 nm defined through an EBL process. After developing, the sample was treated by $CF_4/O_2$ plasma in an RIE system to etch the Si substrate underneath the four panels. In order to protect the PMMA hinge from being etched away, the sample was placed face down in the chamber to eliminate the etching effect from ion bombardment.

It was considered that to achieve self-assembly of the 2D samples into nanocubes, the samples could be exposed under the Ga ion stream, with the beam setup of 30 kV and 10 pA, in an FIB system to generate surface tension force through polymer reflow. However, there was a challenge to protect the graphene from ion irradiation. Even though most of the ions would be imbedded in the 50 nm $Al_2O_3$ protection layer, a small amount of ion leakage into the graphene could cause significant disorder, affecting advanced properties of the graphene. To address possible concerns, the programmable patterning function of the FIB system was used. In the FIB system, a mask can be designed to make the ions only be irradiated to a desired area rather than the entire working area. Therefore, it was possible to expose only the hinge area, rather than the graphene panels, under the ion stream for triggering polymer reflow to induce the surface tension force causing self-assembly. Though it still required a short time to expose the entire structure under the ion stream when aligning the mask with the sample, it was found to not cause significant damage because of the $Al_2O_3$ protection layer and low ion density due to the short exposure time and large working area. The alignment process was tested by exposing graphene with 50, 100, and 150 nm $Al_2O_3$ protection layer under 30 kV ion stream with different beam currents (0, 10, 50, and 100 pA) at the magnification of 3000× for 1 minute. The $I_D/I_G$ values of all the test samples were found to lie in the range of approximately 0-3 with the increasing ion irradiation so that the graphene was considered to be in the "low" defect density, which will not induce significant damage in the graphene.

Figure 34A:
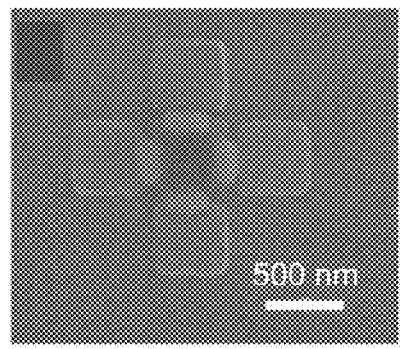
FIGS. 34A-34B are SEM images of samples during stages of the fabrication process of the 5-faced 3D graphene cube described in the Examples section.
Figure 34B:
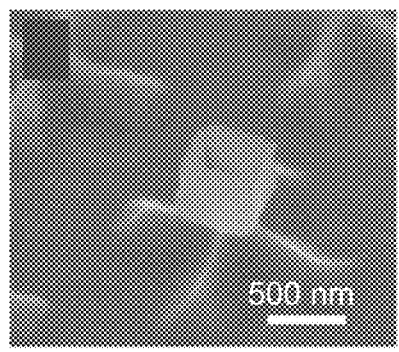

Using the programmable patterning function as described above, the 2D samples were cased to self-assemble into 3D graphene nanocubes. An SEM image of the 2D sample (i.e., before self-assembly) is provided in FIG. 34A; an SEM image of the resultant 3D graphene nanocube (i.e., after self-assembly) is provided in FIG. 34B. The Raman spectrum of the graphene before and after self-assembly revealed no considerable damage in the graphene and such that the advanced properties of the graphene have been preserved.

Although the present disclosure has been described with reference to preferred embodiments, workers skilled in the art will recognize that changes can be made in form and detail without departing from the spirit and scope of the present disclosure.

What is claimed is:

1. An optical sensor for detecting the presence of a foreign material, the sensor comprising:
   a plurality of panels each including a graphene membrane supported by a frame;
   wherein the panels are arranged relative to one another to define a shape having an open, interior volume;
   a plurality of joints, wherein respective ones of the joints interconnect opposing edges of immediately adjacent ones of the panels in the shape;
   wherein graphene plasmons couple across the interior, open volume, and wherein plasmon in each of the membranes are coupled to one another.

2. The optical sensor of claim 1, wherein the optical sensor is a microstructure.

3. The optical sensor of claim 1, wherein the optical sensor is a nanostructure.

4. The optical sensor of claim 1, wherein the graphene membrane includes at least one graphene layer.

5. The optical sensor of claim 1, wherein each of the joints comprises a polymer material.

6. The optical sensor of claim 5, wherein the polymer material has a reflow temperature in the range of approximately 100-170° C.

7. The optical sensor of claim 1, wherein each of the frames comprises a polymer material.

8. The optical sensor of claim 1, wherein at least one of the panels further comprises a metal pattern formed on the corresponding membrane.

9. The optical sensor of claim 1, wherein the optical sensor has a shape selected from the group consisting of a multi-face cube, multi-faced pyramid, and single panel nanotube.

10. A method of fabricating an optical sensor, the method comprising:
    forming a 2D net including panels each having a frame supporting a graphene membrane; and
    subjecting the 2D net to thermal energy, causing the 2D net to self-transition into a 3D graphene sensor having an interior, open volume;

wherein the 3D graphene sensor includes a plurality of joints, wherein respective ones of the joints interconnect opposing edges of immediately adjacent ones of the panels in the shape;

wherein graphene plasmons couple across the interior, open volume and wherein plasmon in each of the membranes are coupled to one another.

11. The method of claim 10, wherein each of the graphene membranes comprises graphene layers.

12. The method of claim 10, wherein each of the joints comprises a polymer.

13. The method of claim 12, wherein the step of heating includes subjecting the 2D net to a temperature of not greater than 200° C.

14. The method of claim 10, wherein each of the frames comprises an epoxy.

15. The method of claim 10, wherein prior to the step of heating, the method further comprising:

forming a metal pattern on the membrane of at least one of the panels.

16. The method of claim 10, wherein the step of forming a 2D net further comprises:

depositing a protection layer over a sacrificial layer; and depositing graphene over the protection layer so as to define the membrane of each of the panels.

17. The method of claim 16, wherein the protection layer comprises a Cr sub-layer and an $Al_2O_3$ sub-layer.

18. The method of claim 16, wherein the step of forming a 2D net further comprises:

lifting the 2D net off of the sacrificial layer.

19. The method of claim 10, wherein the step of forming a 2D net comprises defining a bottom protection layer on a substrate, depositing a graphene membrane onto the bottom protection layer, forming a top protection layer over the graphene membrane, and forming a sacrificial layer over the top protection layer; and further wherein the step of subjecting the 2D net to thermal energy comprises causing the sacrificial layer to melt and generate surface tension forces to curve the 2D net into a 3D cylinder.

20. The method of claim 19, wherein the 3D cylinder has a shape selected from the group consisting of a partially curved cylinder, a nearly completely curved cylinder, and a completely curved cylinder.

* * * * *